(12) United States Patent
Kokubo

(10) Patent No.: US 7,230,493 B2
(45) Date of Patent: Jun. 12, 2007

(54) BIAS CIRCUIT WITH THRESHOLD VOLTAGE CHANGE COMPENSATION FUNCTION AND TEMPERATURE CHANGE COMPENSATION FUNCTION

(75) Inventor: Masayuki Kokubo, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 165 days.

(21) Appl. No.: 11/048,930

(22) Filed: Feb. 3, 2005

(65) Prior Publication Data
US 2005/0168286 A1    Aug. 4, 2005

(30) Foreign Application Priority Data
Feb. 3, 2004    (JP) .............................. 2004-027043

(51) Int. Cl.
*H03F 3/04* (2006.01)
(52) U.S. Cl. ....................................... 330/289
(58) Field of Classification Search ................ 330/285, 330/296, 289
See application file for complete search history.

(56) References Cited

U.S. PATENT DOCUMENTS

| | | | |
|---|---|---|---|
| 5,506,544 A | 4/1996 | Staudinger et al. | |
| 6,160,280 A | 12/2000 | Bonn et al. | |
| 6,304,130 B1 * | 10/2001 | Poulin et al. | 327/430 |
| 6,946,913 B2 * | 9/2005 | Moriwaki et al. | 330/296 |

FOREIGN PATENT DOCUMENTS

| | | |
|---|---|---|
| EP | 0 942 524 | 9/1999 |
| JP | 2001-168699 | 6/2001 |

OTHER PUBLICATIONS

Yamauchi et al.., "X-Band MMIC Power Amplifier With an On-Chip Temperature-Compensation Circuit", IEEE-Transactions on Microwave and Techniques, vol. 49, No. 12, Dec. 2001.
Yamanaka et al., "Bias Circuit for High Yield Self-Bias MMIC Amplifier for APAAS", 2003 IEEE, MTT-S Digest TU5B-3, pp. 121-124.
By Yasuyuki Itou et al., "Base and Application of MMIC Technology", May 31, 1996 Realice company, p. 130.
Yamanaka et al., "Ku-Band Low Noise MMIC Amplifier With Bias Circuit for Compensation of Temperature Dependence and Process Viariation", 2002 IEEE MTT-S Digest Th1B-4, pp. 1427-1430.

* cited by examiner

*Primary Examiner*—Robert Pascal
*Assistant Examiner*—Hieu Nguyen
(74) *Attorney, Agent, or Firm*—Young & Thompson

(57) ABSTRACT

A bias circuit which applies a bias voltage to a control terminal of a first active element for an RF signal amplification, includes a threshold voltage change compensation circuit and a first temperature compensation circuit. The threshold voltage change compensation circuit contains a second active element and compensates the bias voltage based on a change in threshold voltage of the first active element by using the second active element. The first temperature compensation circuit is connected between the control terminal and the voltage change compensation circuit and configured to compensate a change in the bias voltage based on a temperature change.

18 Claims, 27 Drawing Sheets

BIAS CIRCUIT WITH THRESHOLD VOLTAGE CHANGE COMPENSATION FUNCTION AND TEMPERATURE CHANGE COMPENSATION FUNCTION

BACKGROUND OF THE INVENTION

1. Field of the Invention

The present invention relates to a bias circuit that compensation for change in threshold voltage of a transistor and temperature compensation can be accomplished.

2. Description of the Related Art

When an applied voltage to a transistor is fixed in an integrated circuit (IC), there are two problems. That is, one is the change in characteristics of the integrated circuit and decrease in a production yield due to deviation in threshold voltage ($V_{th}$) of the transistor, and the other is change in characteristics of the integrated circuit due to use temperature change. Therefore, it is required to compensate for both of the threshold voltage change of the transistor and the temperature change.

FIG. 1 is a circuit diagram showing a conventional bias circuit with a temperature compensation function (IEEE TRANS. MTT, VOL.49, No12, December 2001). The bias circuit shown in FIG. 1 is connected with a gate bias point 106 of an RF amplifying transistor 104 in an amplifier 151, and has high impedance enough for a high frequency signal due to the resistance 108. The bias circuit includes a diode 202 and a resistance 204. A voltage 201 is applied to the anode of the diode 202, and a voltage 205 is applied to the cathode of the diode 202 through the resistance 204. A node 203 between the cathode and the resistance 204 is connected to the gate bias point 106 of the RF amplifying transistor 104 through the resistance 108.

The amplifier 151 includes a capacitor 107, the RF amplifying transistor 104, and the resistance 108. A radio frequency signal is inputted to one end of the capacitor 107. The gate bias point 106 of the RF amplifying transistor 104 is connected with the other end of the capacitor 107 and one end of the resistance 108. The drain thereof is connected to one end of a resistance 102. A voltage 101 is applied to the drain of the RF amplifying transistor 104 through the resistance 102, and a voltage 105 to the source thereof.

The bias circuit shown in FIG. 1 utilizes a characteristic of the diode shown in FIG. 2, in which a forward voltage $V_f$ increases when temperature decreases in a state that a forward current is kept constant. Generally, a current-voltage characteristic of a Scotty barrier diode is expressed by $$I_f = J_s(exp(qV_f/kT)-1)$$

where $J_s = AT^2 exp(-q\Phi B/kT)$, $I_f$ is a forward current, q is unit electric charge, $V_f$ is a forward voltage, k is the Boltzmann's constant, T is temperature, A is the effective Richardoson's constant, $\phi B$ is a Scotty barrier height of the diode. That is, the voltage drop in the diode 202 becomes large when the temperature decreases, and therefore the voltage at the node 203 on the side of the cathode of the diode 202 lowers. As a result, the voltage $V_{106}$ of the gate bias point 106 lowers, so that the gain of the transistor 104 is restricted. On the other hand, the voltage drop at the diode 202 becomes small when the temperature increases. Therefore the gate bias voltage $V_{106}$ rises so that the gain of the transistor 104 becomes large.

FIG. 3 shows a dependency on the temperature change, of drain current 103 in the transistor 104 ($I_d$: unit mA) using the bias circuit shown in FIG. 1. As shown in FIG. 3, the drain current 103 is restricted with the temperature decrease. In the other words, the bias circuit shown in FIG. 1 has the temperature compensation effect.

Next, FIG. 4 is a circuit diagram showing a conventional bias circuit with a compensation function of a change in threshold voltage (2003 IEEE MTT-S Digest TU5B-3, pp. 121–124). The bias circuit shown in FIG. 4 is connected with the gate bias point 106 of the RF amplifying transistor 104 in the amplifier 151 and has high impedance enough for a high frequency signal by the resistance 108. The bias circuit includes a transistor 305 having a same DC characteristic as the RF amplifying transistor 104, a resistance 303, and a resistance 306. A voltage 301 is applied to the drain of a transistor 305 through the resistance 303. A voltage 308 is applied to the source of the transistor 305. A voltage 307 is applied to the gate of the transistor 305 through the resistance 306. It should be noted that the amplifier 151 in FIG. 4 is the same as shown in FIG. 1.

In the bias circuit shown in FIG. 4, when the threshold voltage $V_{th}$ of the transistor changes by $\Delta V_{th}$, the circuit is set to satisfy the relational of $\Delta Id_2 * R303 = \Delta V_{th}$ where $\Delta Id_2$ is a difference of the drain current 302, and R303 is the resistance value of the resistance 303. When the drain current 302 becomes large by $\Delta Id_2$ with the decrease of the threshold voltage $V_{th}$, the voltage 304 lowers by $\Delta V_{th}$. As a result, the voltage at a gate bias point 106 of the transistor 104 becomes low by $\Delta V_{th}$. On the other hand, when the threshold voltage $V_{th}$ increases, the threshold voltage change $\Delta V_{th}$ is compensated oppositely.

FIG. 7 shows a dependency upon the threshold voltage change ($\Delta V_{th}$: unit V), of the drain current 103 of the transistor 104 (Id: unit mA) when the bias circuit shown in FIG. 4 is used.

FIG. 5 is a circuit diagram showing a conventional circuit (of a self-bias method) which has both of a threshold voltage change compensation function and a temperature change compensation function (by Yasuyuki Itou, et al., "Base and application of MMIC technology", May 31, 1996 Realize company, P. 130). In the circuit shown in FIG. 5, a resistance 406 is connected in series between the source of a RF amplifying transistor 404 and a ground potential GND. A capacitor 407 is connected to the ground in parallel to the resistance 406 for a high frequency signal. Also, a voltage 401 is applied to the drain of the RF amplifying transistor 404 through the resistance 402. A radio frequency signal is supplied to the one end of a capacitor 408. The other end of the capacitor 408 is connected to the gate of the RF amplifying transistor 404.

In the circuit shown in FIG. 5, the following functions are accomplished when the drain current 403 of the transistor 404 is changed due to a temperature change and a threshold voltage change. For instance, when the drain current 403 increases, the voltage 405 becomes high, so that a voltage difference $V_{gs}$ between the gate and the source in the transistor 404 decreases. As a result, the drain current 403 decreases. On contrary, when the drain current 403 decreases, the voltage difference $V_{gs}$ becomes large so that the drain current 403 increases. That is to say, the compensation functions in the circuit shown in FIG. 5 are accomplished to keep the drain current 403 of the transistor 404 constant.

FIG. 6 is a circuit diagram showing another conventional circuit which has functions compensating both of threshold voltage change and temperature change (2002 IEEE MTT-S Digest TH1B-4, pp. 1427–1430). The circuit shown in FIG. 6 is a bias circuit which is connected with a gate bias point 106 of an RF amplifying transistor 104 in an amplifier 151.

The bias circuit includes a first circuit which includes a transistor 504 having a same DC characteristic as the RF amplifying transistor 104, a resistance 502 connected with the drain of the transistor 504, a diode 506, and a resistance 509 connected with the source of the transistor 504, and a second circuit which includes a resistance 511 and a diode 513, which are connected with the gate of the transistor 504.

The gate bias point 106 of the transistor 104 is connected to a node 503 between the drain of the transistor 504 and the resistance 502 through the resistance 108 to have high impedance enough for a high frequency signal. The drain of the transistor 504 is grounded through the resistance 502. The anode of the diode 506 in the first circuit is grounded and the cathode of the diode 506 is connected with a negative voltage 514 through the resistance 509. The source of the transistor 504 is connected to the node 507 between the diode 506 and the resistance 509 in the first circuit. The cathode of the diode 513 is connected to the negative voltage 514, and the anode of the diode 513 is grounded through the resistance 511 in the second circuit. A gate of the transistor 504 is connected to a node 512 between the resistance 511 and the diode 513 in the second circuit. The amplifier 151 in FIG. 6 is the same as shown in FIGS. 1 and 4.

When the threshold voltage $V_{th}$ of the transistor is changed by $\Delta V_{th}$ in the bias circuit shown in FIG. 6, the threshold voltage change $\Delta V_{th}$ is compensated for to satisfy the relational expression of $\Delta I_{d5} * R_{502} = \Delta V_{th}$, where $\Delta I_{d5}$ indicates a change of the drain current 501, and $R_{502}$ indicates the resistance value of the resistance 502. The temperature characteristic of a forward voltage $V_f$ of the diode (shown in FIG. 2) is used when the temperature change has occurred. For instance, the voltage drop across the diode 513 becomes large when the temperature decreases. Therefore, the voltage at the node 512 corresponding to a gate voltage of the transistor 504 increases. The voltage drop across the diode 506 becomes large similarly. Therefore, the voltage at the node 507 corresponding to the source voltage of the transistor 504 decreases. As a result, the voltage between the gate and the source in the transistor 504 increases, so that the drain current 501 of the transistor 504 is increased, resulting in lowering the voltage at the node 503. This is because the voltage drop indicated as the product of the resistance 502 and the drain current 501 becomes large. Therefore, the voltage at the gate bias point 106 which has the same voltage as the voltage 503 decreases in the RF amplifying transistor 104. Consequently, the effect of the temperature compensation is achieved. Thus, the bias circuit shown in FIG. 6 has a relation of drain current and threshold voltage change shown in FIG. 8 and a relation of drain current and temperature change shown n FIG. 9.

Furthermore, Japanese Laid Open Patent Application (JP-P2001-168699A) discloses a technique to maintain a stable operation in spite of the temperature change of the threshold voltage $V_{th}$ of the transistor in a MOSFET for power supply. In the conventional technique, resistances 19, 17, and 16, diodes 21 and 22, and a zenar diode 20 are connected with the gate of MOSFET1, and the threshold voltage change compensation can be achieved in the temperature change.

However, there are the following problems in the above-mentioned conventional techniques. That is, generally, when the threshold voltage change $\Delta V_{th}$ has occurred in the transistor, the change in the characteristics of the transistor occurs if the bias voltage is not changed by the threshold voltage change $\Delta V_{th}$ of the transistor for the RF amplification. The circuit of FIG. 1 has the compensation effect to the temperature change but does not have the compensation effect to the threshold voltage change. Therefore, the drain current 103 decreases, which cause a change in characteristic as the threshold voltage $V_{th}$ becomes shallow.

Generally, a temperature coefficient of an epitaxial resistance formed on a GaAs substrate has a positive coefficient. In the bias circuit of FIG. 4, When the rise of temperature is caused, the values of a drain current 302 of transistor 305 and resistance 303 become large and a product of the drain current 302 and the resistance 303 becomes large. That is, a voltage drop across resistance 303 becomes large. As a result, as the temperature increases, the gate bias 106 of the transistor 104 for the RF amplification becomes low to decrease the drain current 103, resulting in the degradation of the RF characteristic. In this way, in case of the bias circuit of FIG. 4, there is not a compensation effect to the temperature change.

Also, when the gain of the transistor 104 should be kept constant to the temperature change, it is needed to decrease the drain current 103 with the temperature decrease. In the bias circuit of FIG. 5, the temperature change compensation effect is insufficient because the bias circuit has only a function to keep the drain current 103 constant to the temperature change.

In the bias circuit of FIG. 6, three current paths for the drain current 501 of the transistor 504, for a current 505 flowing through the diode 506 and the resistance 509, and for a current 510 flowing through the resistance 511 and the diode 513 are needed. Therefore, the consumption current becomes large.

In the technique disclosed in Japanese Laid Open Patent Application (JP-P2001-168699A), it is possible to compensate for the threshold voltage change to the temperature change but it not possible to compensate for the threshold voltage change to change on the manufacturing.

SUMMARY OF THE INVENTION

An object of the present invention is to provide a bias circuit which can carry out both of compensation of a threshold voltage change and compensation of a temperature change.

In an aspect of the present invention, a bias circuit which applies a bias voltage to a control terminal of a first active element for RF signal amplification, includes a threshold voltage change compensation circuit and a first temperature compensation circuit. The threshold voltage change compensation circuit contains a second active element and compensates the bias voltage based on a change in threshold voltage of the first active element by using the second active element. The first temperature compensation circuit is connected between the control terminal and the voltage change compensation circuit and configured to compensate a change in the bias voltage based on a temperature change.

Here, the first and second active elements may be transistors. In this case, the first and second active elements may be voltage controlled-type transistors, or current controlled-type transistors. The second active element preferably has a same threshold voltage as the first active element.

Also, the threshold voltage change compensation circuit preferably includes a first resistance connected with the second active element.

In this case, the threshold voltage change compensation circuit may further include a second temperature compensation circuit configured to compensate a first voltage of a first node between the first resistance and the second active element based on the temperature change. The second temperature compensation circuit may include a first diode circuit containing at least one diode.

Alternatively, the bias circuit may further include a second temperature compensation circuit interposed between the threshold voltage change compensation circuit and the first temperature compensation circuit to compensate a first voltage of a first node between the first resistance and the second active element based on the temperature change. The second temperature compensation circuit may include a first diode circuit containing at least one diode. In either case, it is preferable that the diode in the first diode circuit is a Schottky diode or a diode with a negative temperature coefficient.

Also, the first temperature compensation circuit preferably includes a second diode circuit containing at least one diode. The first temperature compensation circuit may further include a second resistance connected with the second diode circuit. It is preferable that the diode in the second diode circuit is a Schottky diode or a diode with a negative temperature coefficient.

Also, a second node between the second resistance and the second diode circuit is connected with the control terminal, and the bias circuit may further include an additional circuit comprising a third resistance and a third active element connected with the third resistance, connected with the first temperature compensation circuit on a lower voltage side of the first temperature compensation circuit.

In this case, the additional circuit may further include a third temperature compensation circuit configured to compensate a second voltage of a third node between the third resistance and the third active element based on the temperature change. The third temperature compensation circuit may include a third diode circuit containing at least one diode. It is preferable that the diode in the second diode circuit is a Schottky diode or a diode with a negative temperature coefficient. Also, it is preferable that the second and third active elements have a same threshold voltage as the first active element.

DESCRIPTION OF THE PREFERRED EMBODIMENT

Hereinafter, a bias circuit of the present invention will be described in detail with reference to the attached drawings.

[First Embodiment]

Figure 10:
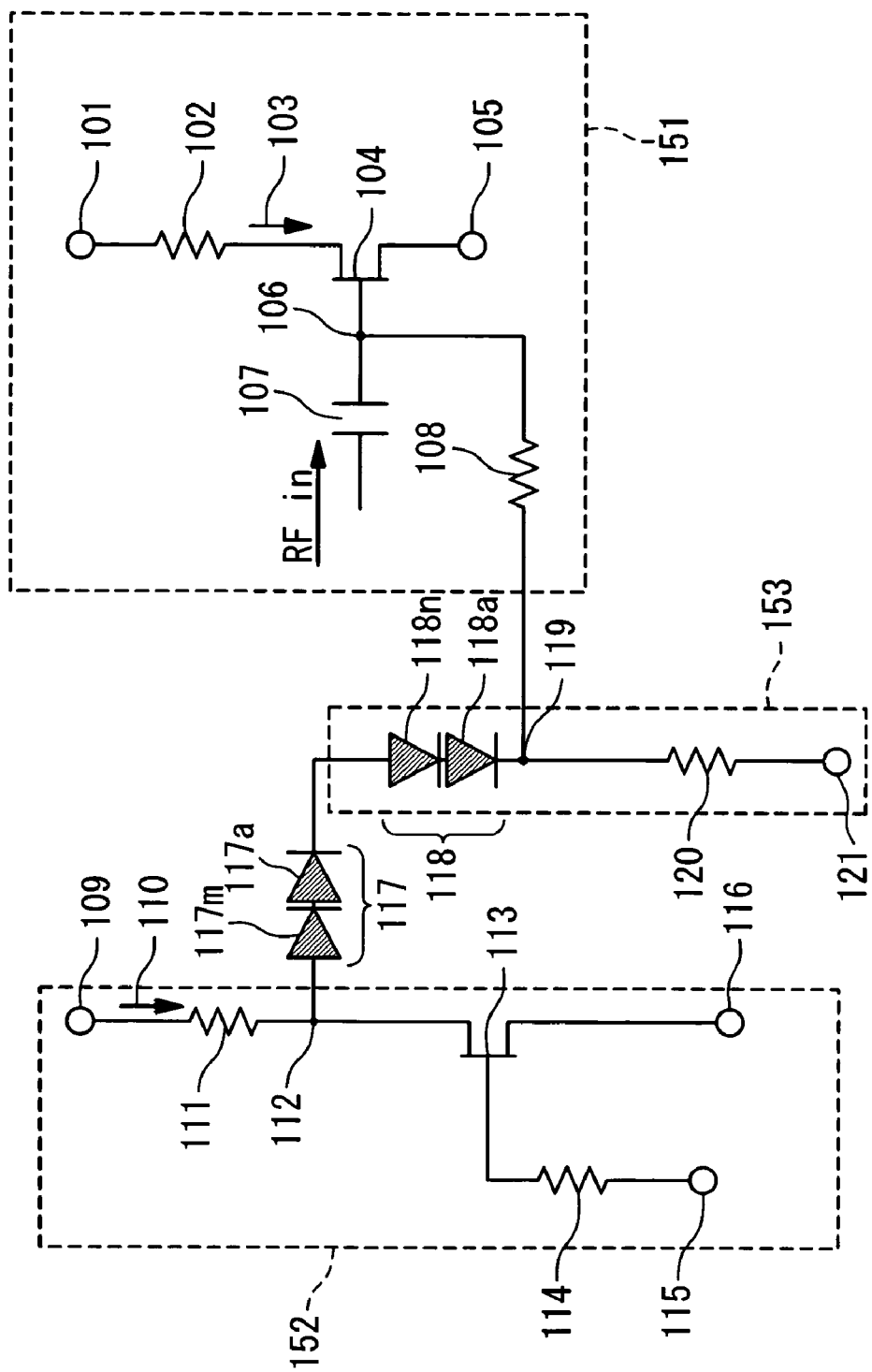
FIG. 10 is a circuit diagram showing the circuit configuration of a bias circuit according to a first embodiment of the present invention.

FIG. 10 is a circuit diagram showing the configuration of the bias circuit according to the first embodiment of the present invention. The bias circuit has both of a compensation function of threshold voltage change and a compensation function of temperature change.

Figure 1:
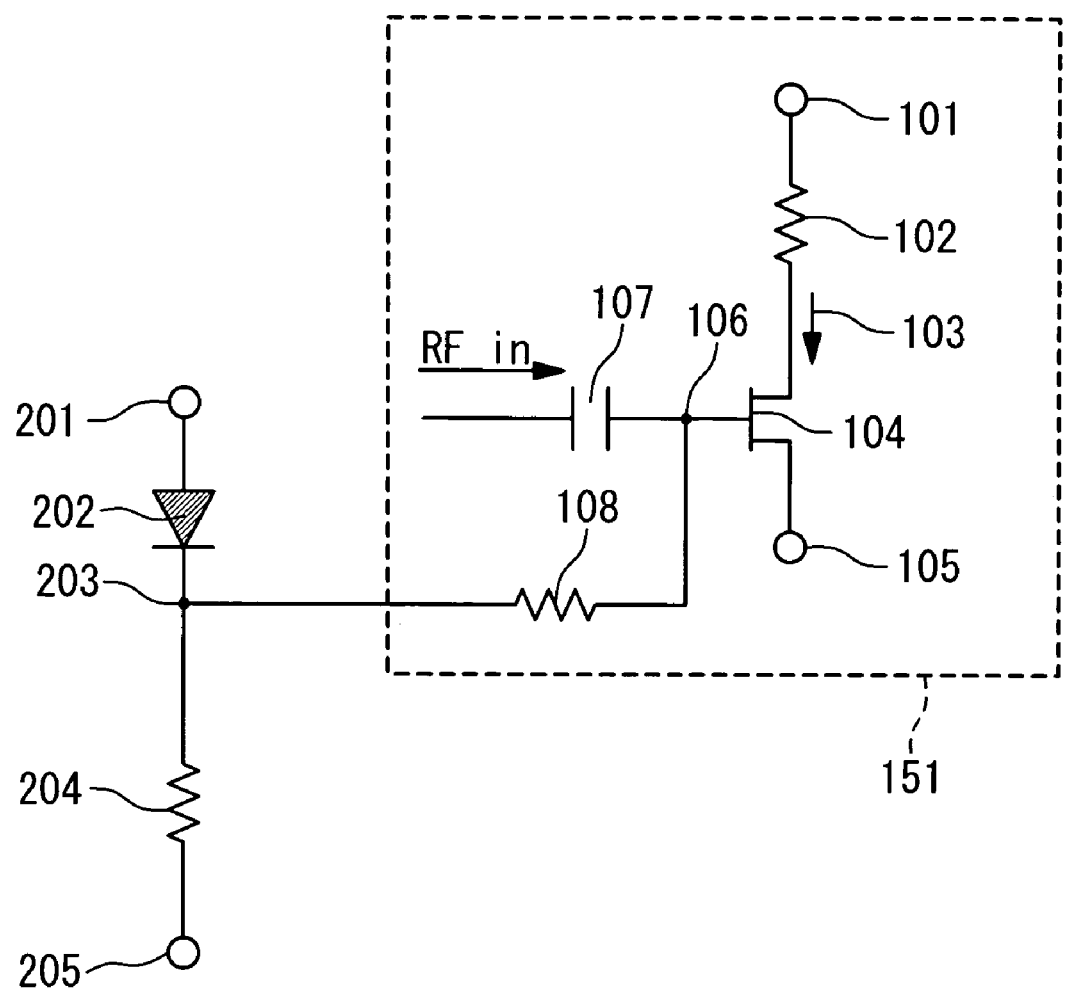
FIG. 1 is a circuit diagram showing a bias circuit having a temperature compensation function of a first conventional example.
Figure 4:
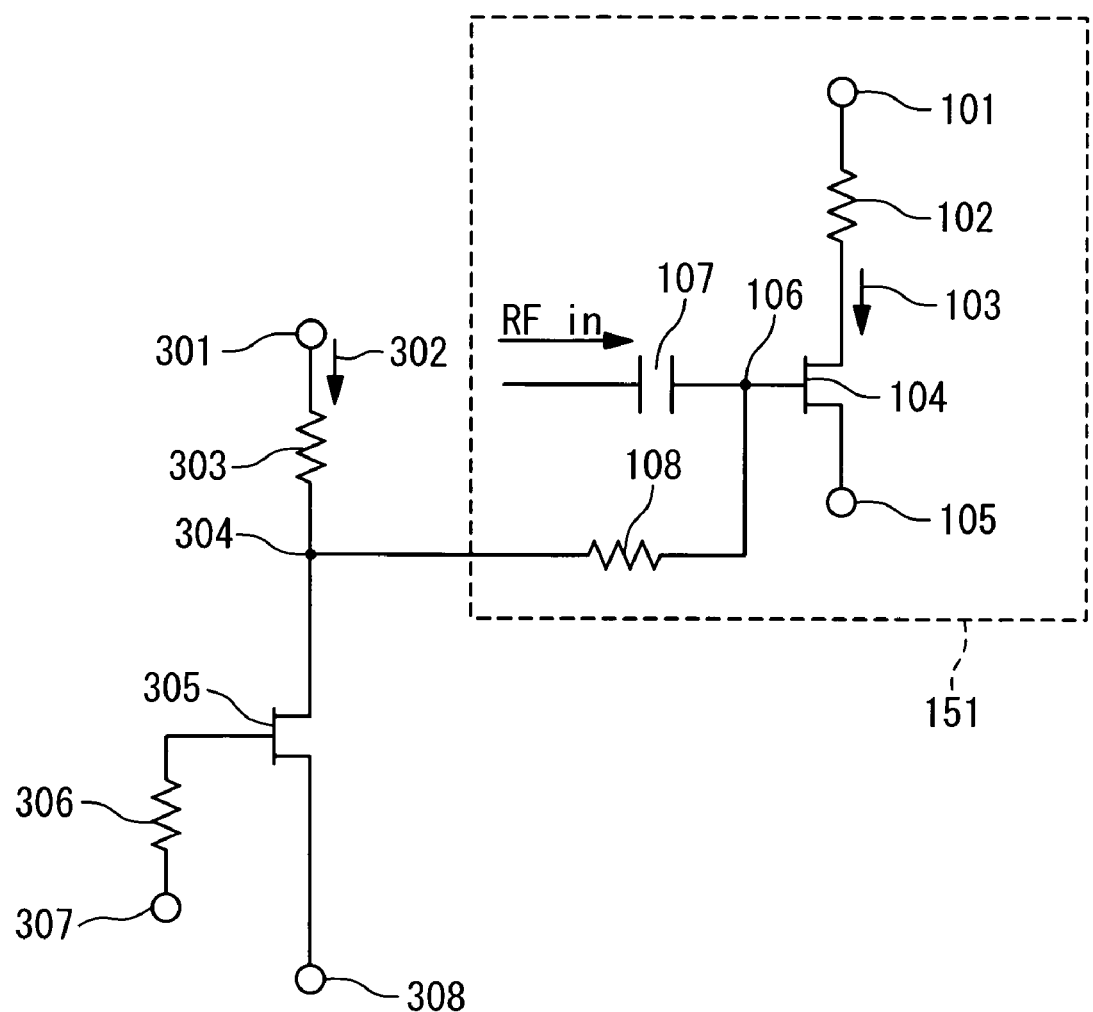
FIG. 4 is a circuit diagram showing a bias circuit with a threshold voltage change compensation function of a second conventional example.
Figure 6:
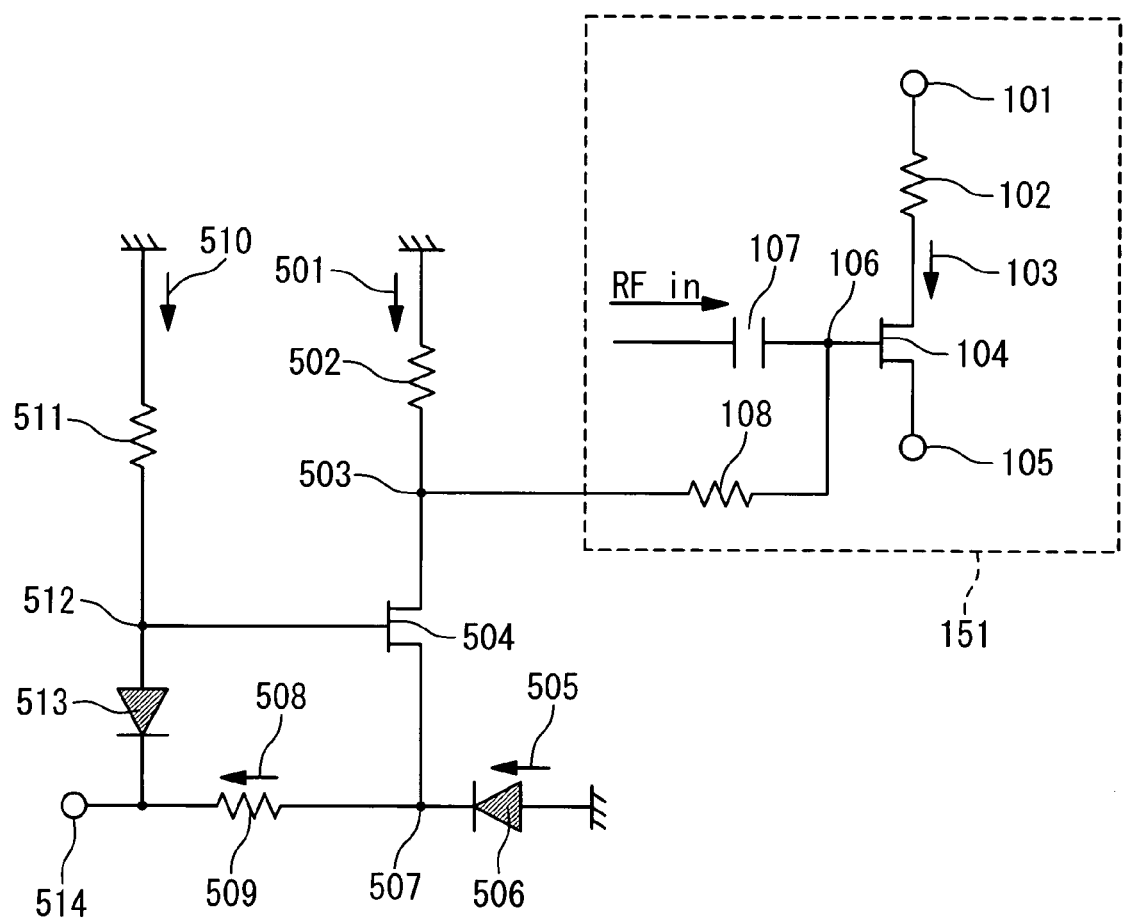
FIG. 6 is a circuit diagram showing a fourth conventional circuit with threshold voltage change function and temperature change compensation.
Figure 7:
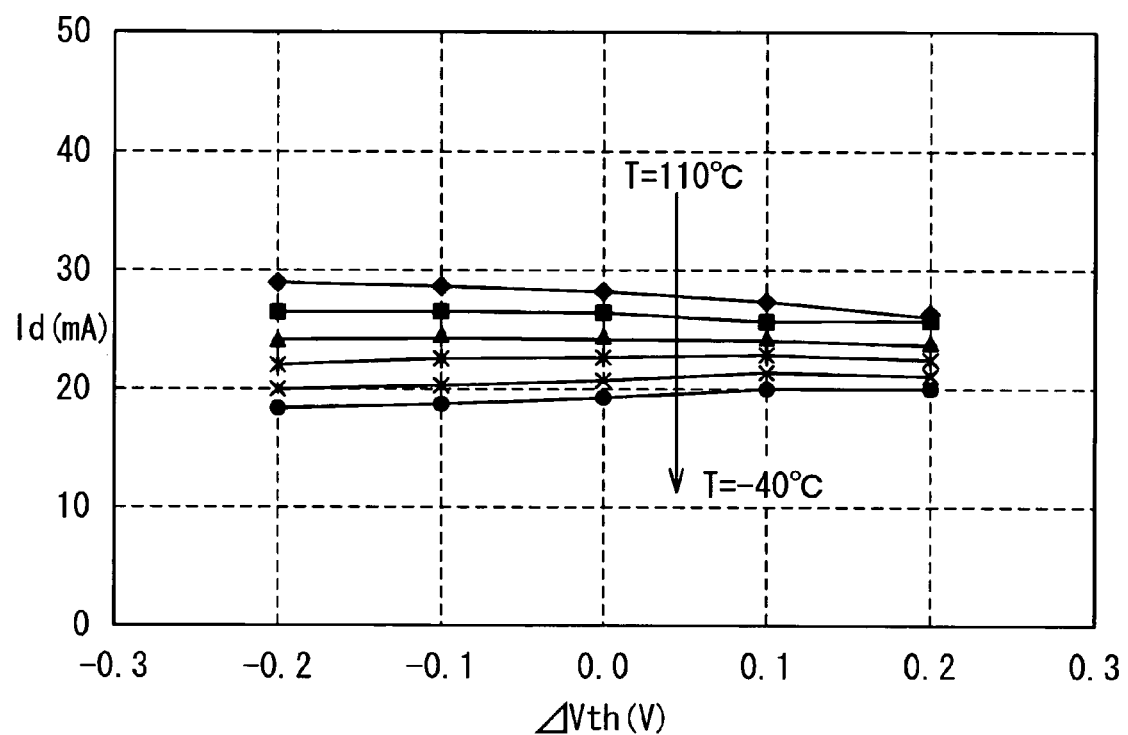
FIG. 7 is a graph showing a dependency of drain current of a transistor upon threshold voltage change when the bias circuit shown in FIG. 4 is used.
Figure 8:
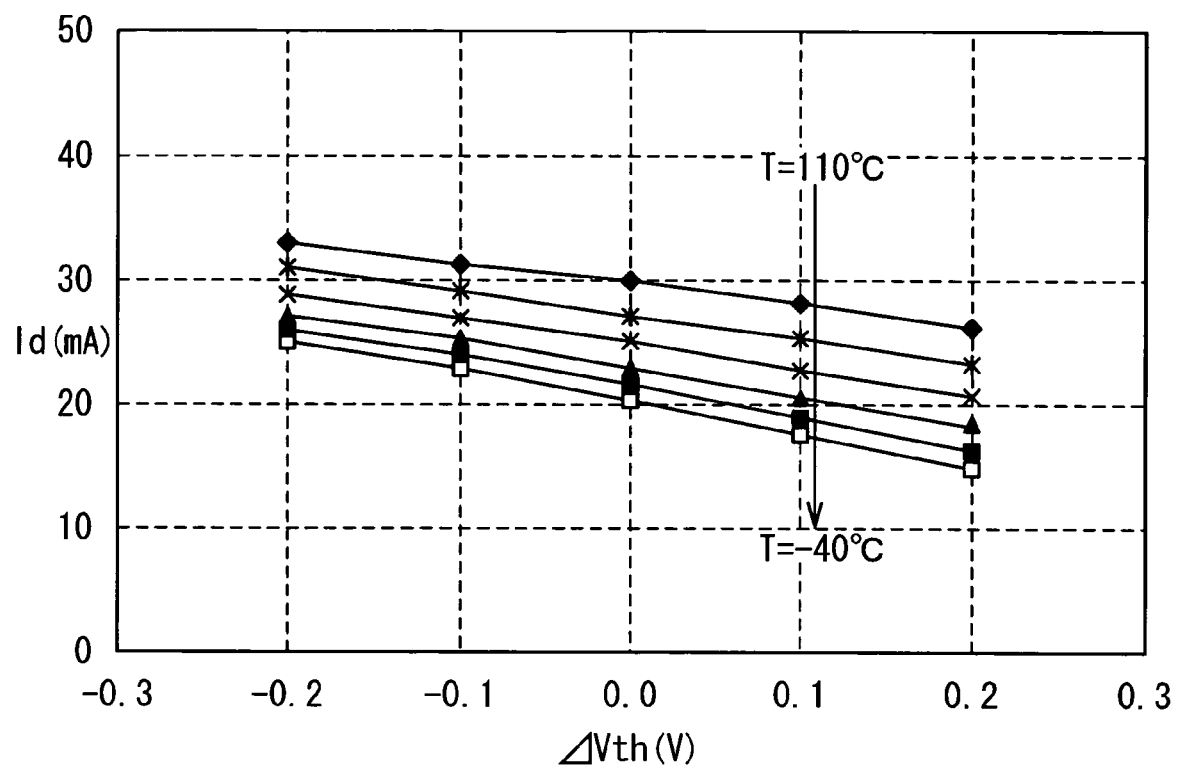
FIG. 8 is a graph showing a dependency of drain current of a transistor upon threshold voltage change when the bias circuit shown in FIG. 6 is used.
Figure 9:
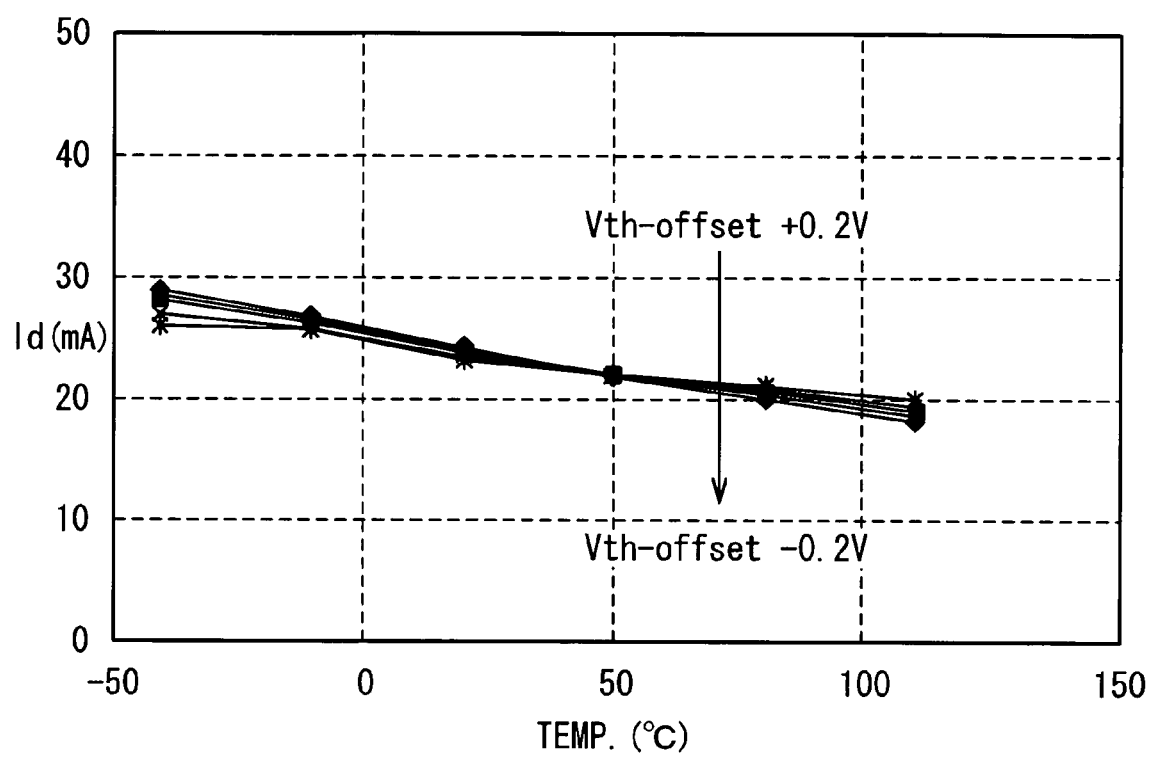
FIG. 9 is a graph showing a dependency of drain current of a transistor upon temperature change when the bias circuit shown in FIG. 6 is used.

It should be noted that an amplifier 151 shown in FIG. 10 has the same configuration as those of shown in FIGS. 1, 4 and 6. That is to say, the amplifier 151 includes a capacitor 107, a RF amplifying transistor 104 (a first active element for RF signal amplification), and a resistance 108. A RF signal is supplied to one end of the capacitor 107. A gate bias point 106 connected with a control terminal of the transistor 104 is connected between the other end of the capacitor 107. The resistance 108 is connected with the gate bias point 106. A voltage 101 is applied to the drain of the RF amplifying transistor 104 through the resistance 102, and a voltage 105 is applied to the source of the RF amplifying transistor 104.

As shown in FIG. 10, the bias circuit is connected with the gate bias point 106 of the RF amplifying transistor 104 in the amplifier 151 through the resistance 108. The bias circuit has high impedance enough for a high frequency signal by the resistance 108, and includes a temperature compensation circuit 153 and a threshold voltage change compensation circuit 152 for compensation of a threshold voltage change.

The temperature compensation circuit 153 has n (n is a positive integer) diodes 118 (118a to 118n) and a resistance 120, which are connected in series. A voltage 121 is applied to the cathode of the diode 118 through the resistance 120.

The threshold voltage change compensation circuit 152 supplies a voltage to the amplifier 151 through the temperature compensation circuit 153. The threshold voltage change compensation circuit 152 includes a transistor 113 (a second active element) which has the same DC characteristic as the RF amplifying transistor 104 (having the same threshold voltage as the RF amplifying transistor 104), a resistance 111 connected with the drain of the transistor 113, and a resistance 114 connected with the gate of the transistor 113. A voltage 109 is applied to the drain of the transistor 113 through the resistance 111. A voltage 115 is applied to the gate of the transistor 113 through the resistance 114. A voltage 116 is applied to the source of the transistor 113.

The anode of the first one of the n diodes 118 in the temperature compensation circuit 153 is connected with a node 112 between the resistance 111 and the drain of the transistor 113 in the threshold voltage change compensation circuit 152. In addition, m (m is a positive integer) diodes 117 (117a to 117m) are connected in series between the voltage 109 and the voltage 119 at the cathode of the end one of the diodes 118. The diodes 117 compensate a voltage change at the node 112 due to a change of a drain current 110 flowing through the resistance 111 and the transistor 113, i.e., a voltage change supplied from the threshold voltage change compensation circuit 152 to the temperature compensation circuit 153, depending on a temperature change. Thus, the diodes 117 functions as a second temperature compensation circuit. More specifically, the diodes 117 are connected in series between the node 112 and the anode of the first one of the diodes 118.

For instance, in order to keep a gain of an integrated circuit constant, a bias is set in such a way that a gain is maximum at a high temperature and the drain current 103 is restricted with the decrease of the temperature. When the threshold voltage change is caused, the voltage at the gate bias point 106 (the gate voltage $V_{106}$) in the RF amplifying transistor 104 is shifted by only an amount according to the threshold voltage change to keep the drain current 103 constant. Such a transistor will be described below. The threshold voltage change compensation circuit 152 compensates the threshold voltage change $\Delta V_{th}$, in which the voltage 109 is applied through the resistance 111 with a resistance value $R_{111}$ to the transistor 113 which has the same DC characteristic as the transistor 104. The resistance value $R_{111}$ of the resistance 111 is set to satisfy the relation of $\Delta V_{th} = R_{111} * \Delta I_{d110}$ (the amount of the change of current 110 according to the threshold voltage change).

Figure 2:
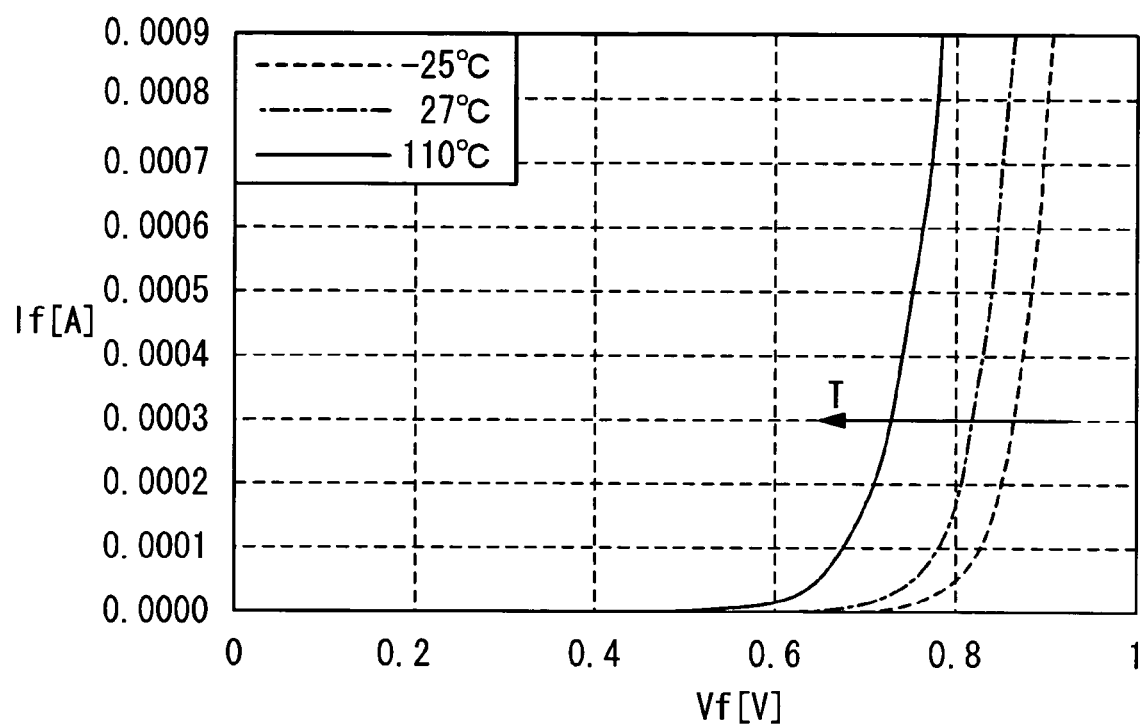
FIG. 2 is a graph a diode used in the bias circuit shown in FIG. 1.
Figure 3:
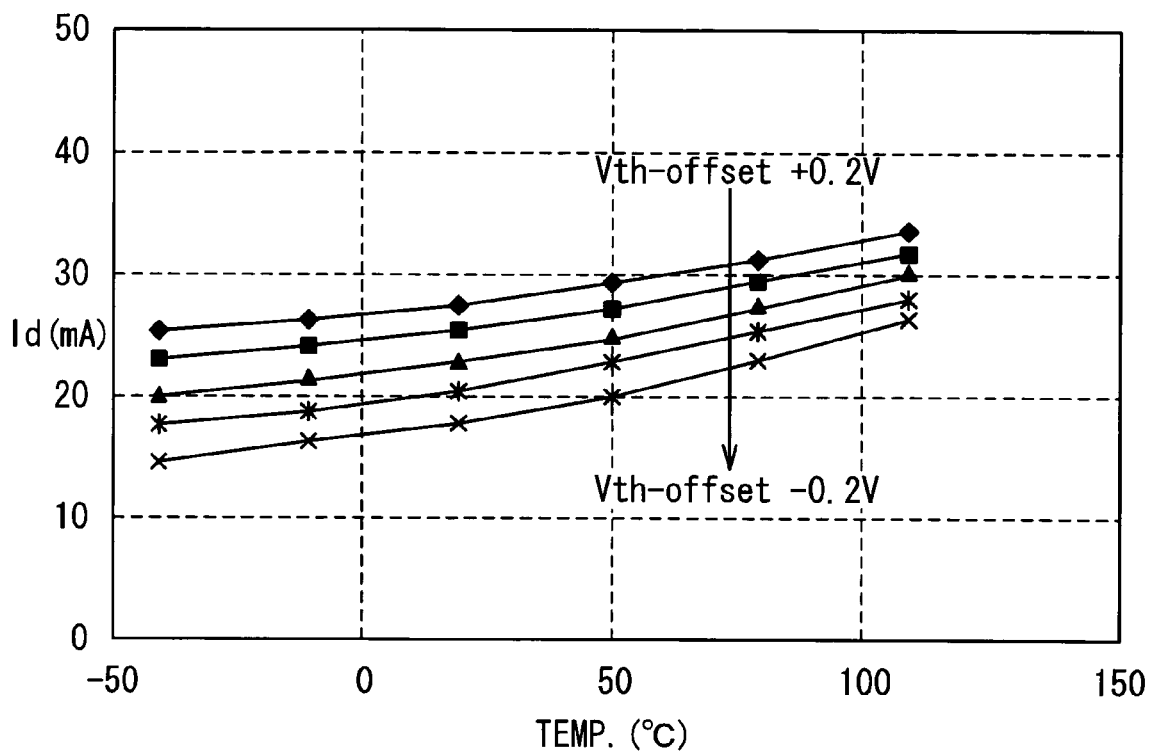
FIG. 3 is a graph showing a dependency of drain current of the transistor of temperature change when the bias circuit shown in FIG. 1 is used.

In the temperature compensation circuit 153, a characteristic shown in FIG. 2 is used in which a forward voltage $V_f$ of the diodes 118a to 118n of the diode 118 increases with the decrease of the temperature. The number n of the diodes 118a to 118n is selected so that a relation of $\Delta V_f * n = \Delta V_{106}$ is satisfied, i.e., the change of forward voltages $V_f$ of the diodes due to the temperature ($\Delta V_f$) is equal to the change of the voltage $V_{106}$ of the gate bias point 106 in the transistor 104 which is necessary to restrict the drain current with the decrease of the temperature. According to the above-mentioned characteristic of the diode, a voltage drop from the set voltage at the node 112 becomes large at a low temperature. As a result, the voltage 119 becomes low, which is the same voltage as the gate bias point 106 in the transistor 104. That is, it is possible to lower the voltage $V_{106}$ of the gate bias point 106 with the decrease of the temperature. On contrary, when the temperature rises, the voltage drop from set voltage at the node 112 becomes small, so that the voltage $V_{106}$ of the gate bias point 106 can be raised. In this way, the gain change of the transistor 104 due to the temperature change can be restrained.

In general, a resistance value changes with a certain coefficient to a temperature change. The temperature coefficient is a positive value to the temperature change usually in the resistance using a GaAs epitaxial layer. Therefore, the temperature change causes that the resistance value $R_{111}$ of the resistance 111 changes by $\Delta R_{111}$. Moreover, the drain current 110 ($I_{d110}$) of the transistor 113 has a temperature change of $\Delta I_{d110}$. For instance, when the temperature rises, the resistance value $R_{111}$ of the resistance 111 becomes large, so that the voltage drop as a product of the drain current 110 and the resistance value becomes large. Therefore, the voltage becomes low at the node 112 between the temperature compensation circuit 153 and the threshold voltage change compensation circuit 152. In this way, the voltage at the node 112 changes as $\Delta V_{112} = \Delta R_{111}(I_{d110} + \Delta I_{d110}) + \Delta I_{d110}(R_{111} + \Delta R_{111})$ due to the temperature change. This means that the above-mentioned simple connection of the threshold voltage change compensation circuit 152 and the temperature compensation circuit 153 cannot satisfy both compensation functions for the threshold voltage change and the temperature change.

For this reason, in order to compensate the change of the voltage $V_{112}$ at the node 112 ($\Delta V_{112}$) due to the temperature change, the number m of the diodes 117a to 117m is determined so as to meet $\Delta V_{112} = \Delta R_{111} * (I_{d110} + \Delta I_{d110}) + \Delta I_{d110} * (R_{111} + \Delta R_{111}) \approx \Delta V_f * m$. The diodes 117a to 117m are connected in series between the voltage 109 and the voltage 119, specifically, between the node 112 and the anode of the first one of the diodes 118 in the first embodiment.

By adopting the above-mentioned circuit structure, the bias circuit can achieve compensation functions for both of the threshold voltage change and the temperature change.

In the application of the bias circuit in the first embodiment, the number of diodes m should be preferably small from the viewpoint of a chip area. This implies that the change of the voltage $V_{112}$ at the node 112 due to the temperature change should be also preferably small, from the above-mentioned relation of $\Delta V_{112} = \Delta R_{111} * (I_{d110} + \Delta I_{d110}) + \Delta I_{d110} * (R_{111} + \Delta R_{111}) \approx \Delta V_f * m$. When the Id-Vg characteristic of the transistor 113 changes approximately linearly to the threshold voltage change, the value of the resistance 111 is uniquely determined from the relational of the drain current change due to the threshold voltage change, $\Delta I_{d110} * R_{111} = \Delta V_{th}$. Accordingly, $\Delta R_{111}$ and $(R_{111} + \Delta R_{111})$ are also uniquely decided. Therefore, it is sufficient to reduce $(I_{d110} + \Delta I_{d110})$ in order to reduce $\Delta V_{112}$. Consequently, it is preferable that the gate bias point of the transistor 113 is biased to a vicinity of the threshold voltage $V_{th}$.

Figure 11:
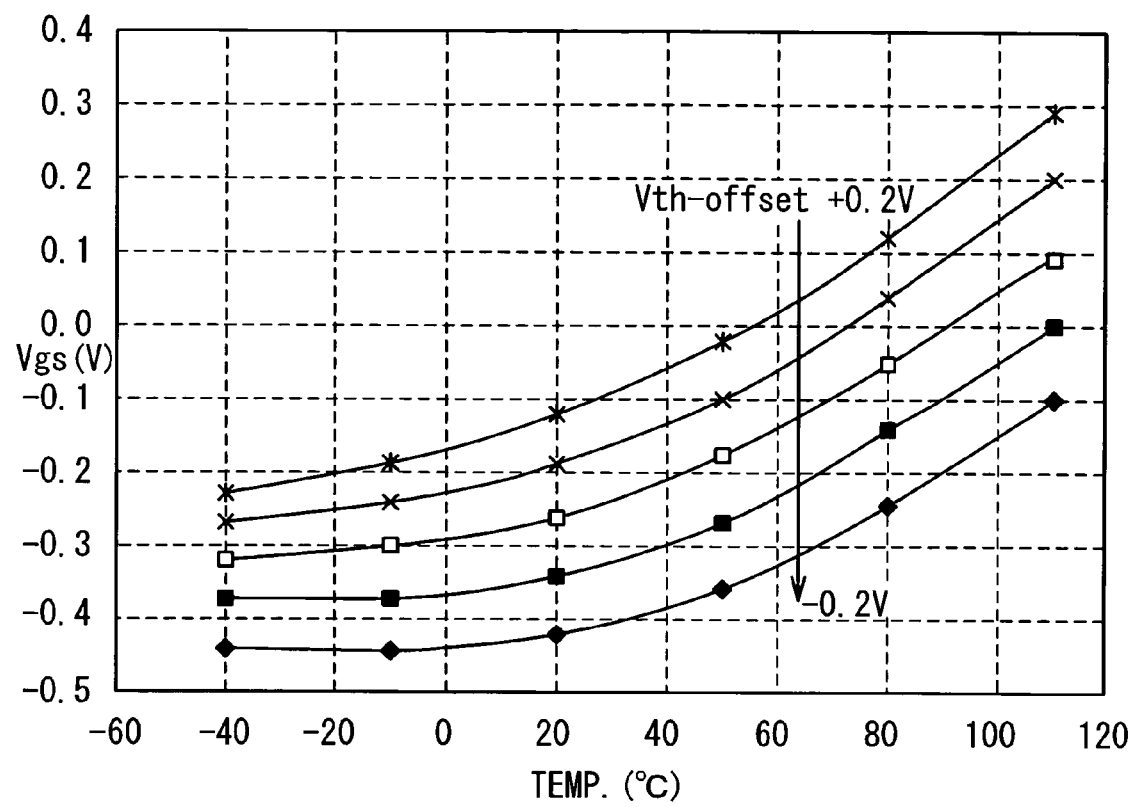
FIG. 11 is a graph showing voltage change of a gate bias point of an RF amplifying transistor when the bias circuit shown in FIG. 10 is used.

FIG. 11 is a graph showing the voltage change of the gate bias point 106 (the gate voltage $V_{106}$) of the RF amplifying transistor 104 when the bias circuit shown in FIG. 10 is used. Specifically, FIG. 11 shows a calculation result at 25° C. under the following conditions, that is, the drain current 110 of the transistor 113 $I_{d110}$=8 mA, the resistance value of the resistance 111 connected with the drain of the transistor 113 $R_{111}$=40Ω, the number m of the diodes 117 for compensation of the voltage at the node 112 is 2, the number n of diodes 118 in the temperature compensation circuit 153 is 2, the resistance value $R_{120}$ of the resistance 120 in the temperature compensation circuit 153 is 1.2 KΩ, the temperature change range is from −40° C. to +110° C., and the threshold voltage change is from −0.2V to +0.2V. The result was obtained that the gate voltage $V_{106}$ is offset so as to compensate for the threshold voltage change, such that the gate voltage lowers with the temperature decrease in any threshold voltage.

Figure 12:
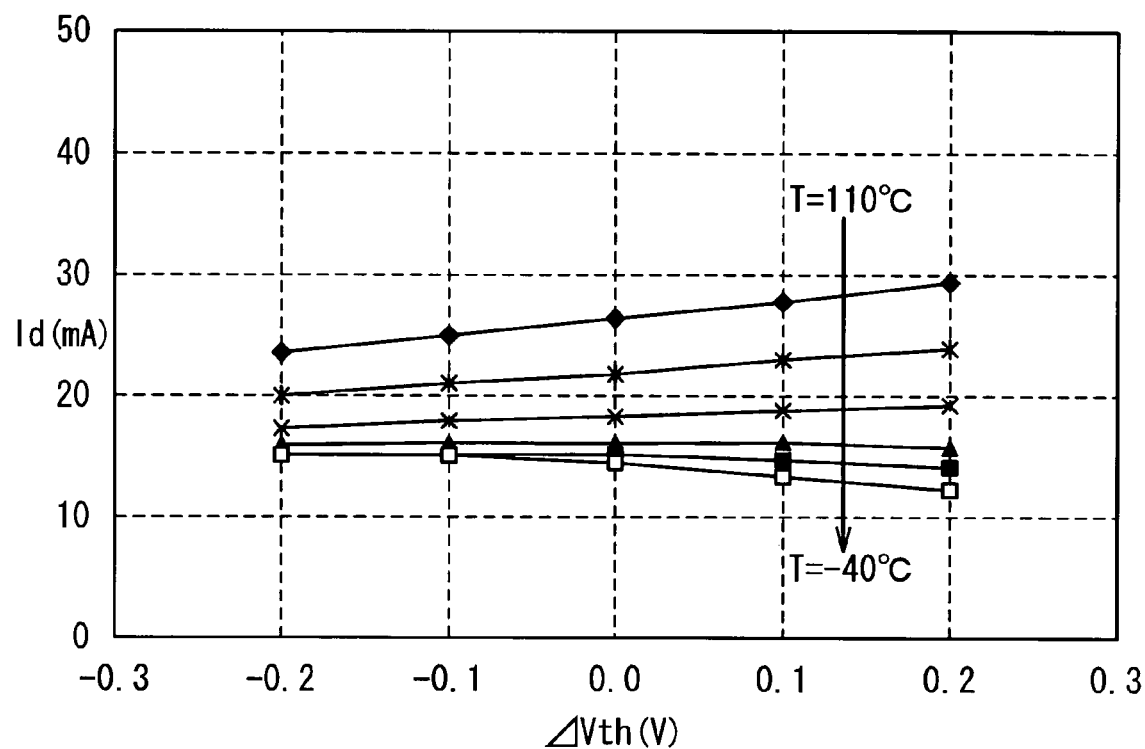
FIG. 12 is a graph showing a relation of drain current and threshold voltage change in the bias circuit shown in FIG. 10.
Figure 13:
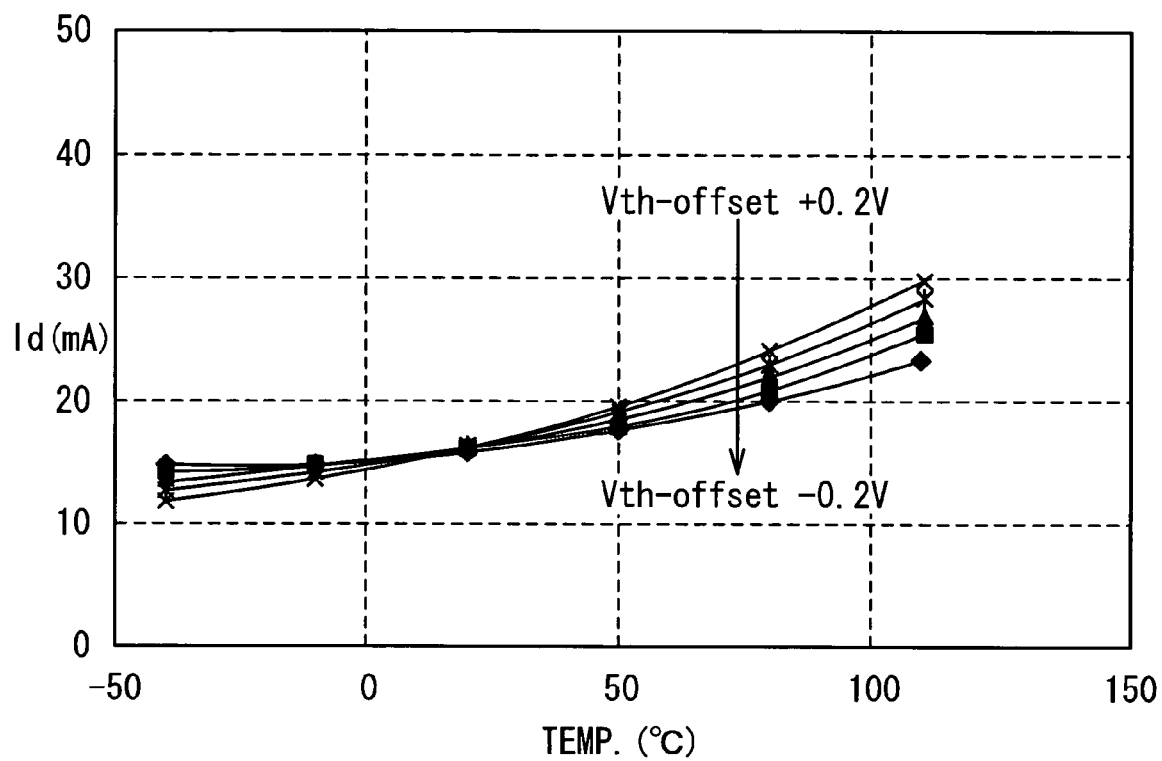
FIG. 13 is a graph showing a relation of the drain current and temperature change in the bias circuit shown in FIG. 10.

FIGS. 12 and 13 show the change of the drain current 103 in the transistor 104 in this case. In FIG. 12, the drain currents 103 are plotted to the threshold voltage change, and in FIG. 13, the drain current 103 are plotted to the temperature change. FIG. 12 indicates that the bias circuit shown in FIG. 10 operates so that the drain current 103 becomes constant even if the threshold voltage changes. Also, FIG. 13 indicates that the bias circuit shown in FIG. 10 operates so that the drain current 103 is lowered with the temperature decrease. In this way, it is possible to compensate for both of the threshold voltage change and the temperature change by using the bias circuit in the first embodiment.

Next, an effect for the RF characteristic will be described, when the bias circuit in the first embodiment is used. S21 characteristics (a small signal gain) were calculated and compared, in which both the conventional circuit shown in FIG. 5 and the bias circuit in the first embodiment in the above conditions are applied to a two-stage amplifier of the 38 GHz band. The conventional circuit has both compensation functions for the threshold voltage change and the temperature change. The temperature change is in the rage of −40° C. to +110° C., and the threshold voltage change is in a range of ±0.2V.

Figure 5:
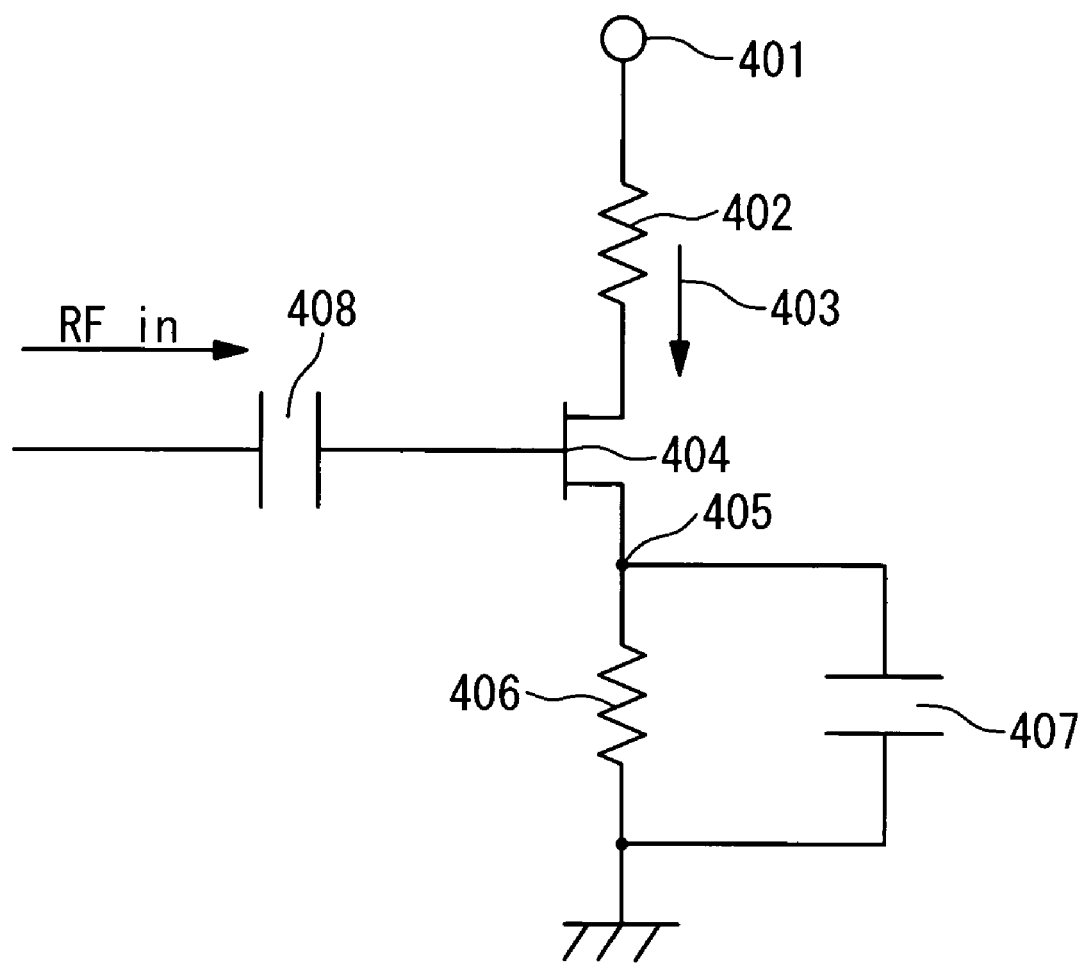
FIG. 5 is a circuit diagram showing a third conventional circuit of a self-bias method with both of a threshold voltage change compensation function and a temperature change compensation function.

In the conventional circuit shown in FIG. 5, ΔS21=5.64 dB, and in the bias circuit in the first embodiment, ΔS21=2.88 dB. The results show that the S21 characteristic change can be restrained to about ½ in the bias circuit, which greater improvement can be achieved comparing with the conventional circuit.

In this way, according to the bias circuit in the first embodiment, the temperature compensation circuit 153, in which the n diodes 118 and a resistance 120 are connected in series, and the threshold voltage change compensation circuit 152, in which the bias voltage is applied to the drain of the transistor 113, which has the same DC characteristic as the RF amplifying transistor 104, through the resistance 111. The temperature compensation circuit 153 is connected with the threshold voltage change compensation circuit 152 through the m diodes 117a to 117m connected in series and provided the node between the drain of transistor 113 and the resistance 111 and the anode of the first one of the n diodes 118a to 118n in order to compensate the temperature change of the resistance 111. Therefore, by setting the resistance value $R_{111}$ of the resistance 111 to meet $\Delta V_{th}=R_{111}*\Delta I_{d110}$, when the drain current 110 of the transistor 113 changes by $\Delta I_{d110}$, it is possible to change the voltage $V_{106}$ of the gate bias point 106 of the transistor 104 by $\Delta V_{th}$ even when the threshold voltage changes. Thus, the compensation is in effective. Also, in case of the temperature change, the number n of the diodes 118a to 118n connected in series is set to meet $\Delta V_f*n \approx \Delta V_{gs}$, namely, such that the change of the forward voltages $V_f$ of the diodes is equal to the change of the $V_{gs}$ of the transistor 104 necessary for compensation of the temperature change. In addition, the number m of the diodes is determined to meet the relation of ΔR*(Id+ΔId)+Δid*(R+ΔR)≈$\Delta V_f$*m, since the resistance 111 connected with the drain of the transistor 113 and the drain current Id of the transistor 113 have temperature dependence. Thus, the voltage applied to the temperature compensation circuit 153, configured by the n diodes 118a to 118n and the resistance 120 is compensated by using the m diodes 117a to 117m.

In this way, the temperature change of the resistance 111 and the transistor 113 used in the circuit 152 is compensated by the m diodes 117a to 117m. Thus, the bias circuit has both functions of compensation for both of the threshold voltage change and the temperature change, resulting in improvement of the characteristic change and increase of a production yield of IC.

[Second Embodiment]

Figure 14:
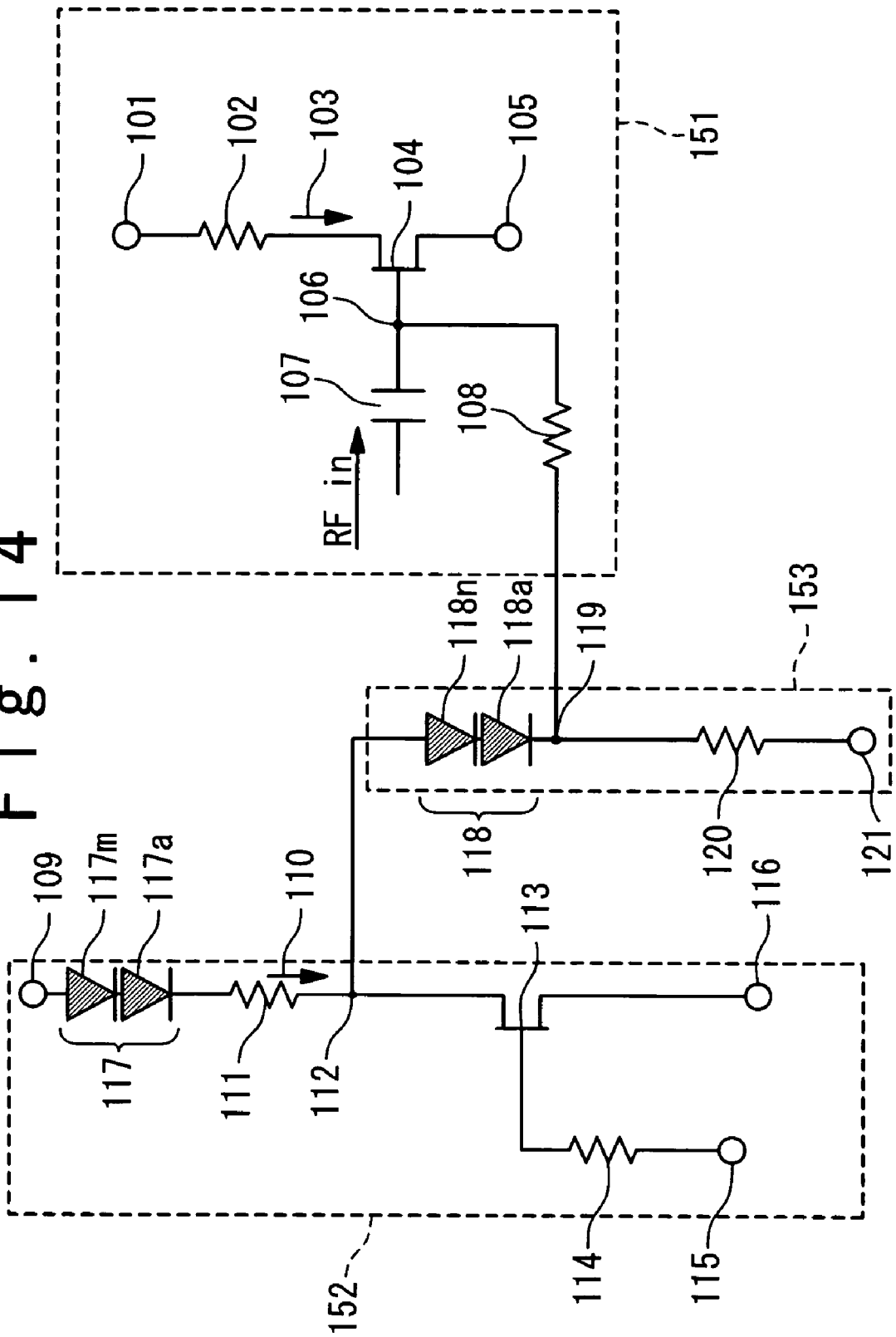
FIG. 14 is a circuit diagram showing the circuit configuration of the bias circuit according to a second embodiment of the present invention.

FIG. 14 shows a circuit diagram of the bias circuit according to the second embodiment of the present invention. The bias circuit has both of the threshold voltage change compensation function and the temperature change compensation function as well as in the first embodiment. In the second embodiment, the temperature compensation circuit 153 is configured of diodes 118 and a resistance 120 and operates to lower the voltage 119 with the decrease of the temperature, as well as in the first embodiment. The threshold voltage change compensation circuit 152 is configured of a transistor 113 and a resistance 111, and carries out the threshold voltage change compensation by a drain current change $\Delta I_{d110}$ of the transistor 113 due to the threshold voltage change and the resistance 111.

In the second embodiment, as shown in FIG. 14, the diodes 117 are not connected between the node 112 and the anode of the first one of the diodes 118, but between the voltage 109 and the node 112 in series. More specifically, the diodes 117 are connected between the voltage 109 and the resistance 111. As a result, a voltage change at the node 112 due to the temperature change of the resistance 111 can be compensated by the diodes 117, as well as in the bias circuit in the first embodiment. It should be noted that the configuration of the bias circuit other than the above-mentioned portion in the second embodiment is the same as that in the first embodiment. Therefore, the description is omitted by assigning the same reference numerals.

Figure 15:
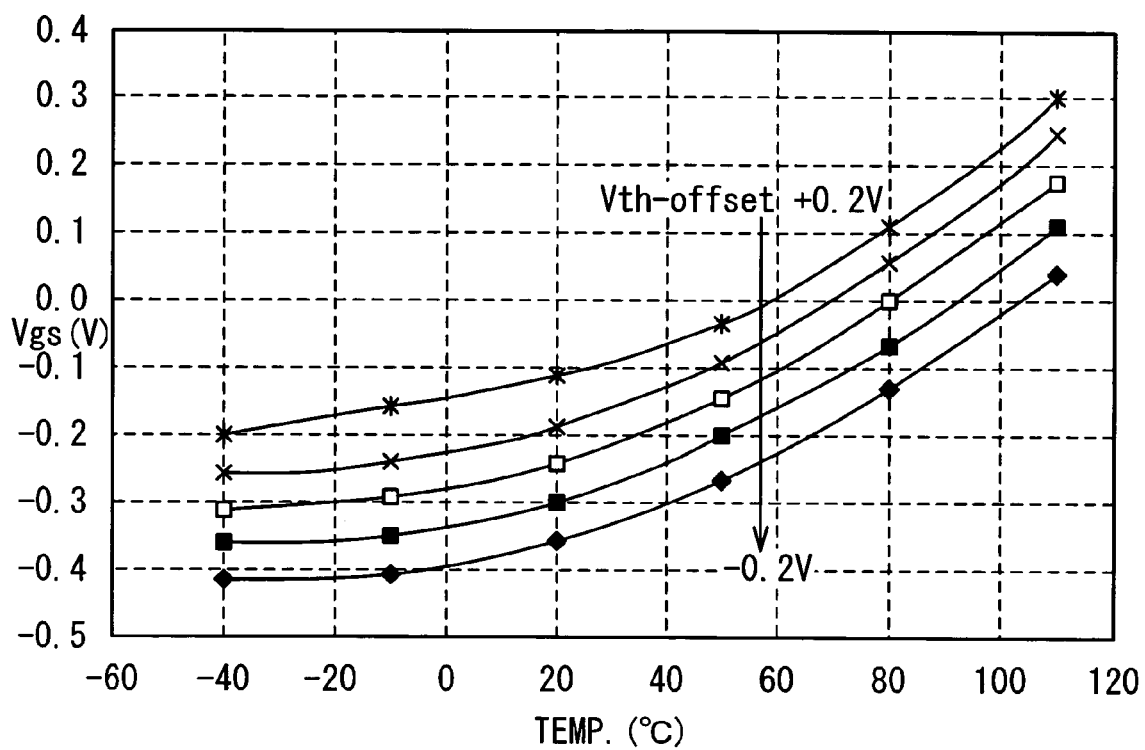
FIG. 15 is a graph showing a relation of voltage change of gate voltage in the RF amplifying transistor when the bias circuit shown in FIG. 14 is used.

FIG. 15 is a graph showing the voltage change of the gate voltage $V_{106}$ of the RF amplifying transistor 104 when the bias circuit shown in FIG. 14 is used. More specifically, FIG. 15 shows calculation results at 25° C. for the following conditions, that is, the drain current 110 $I_{d110}$ of the transistor 113 is 8 mA, the resistance value $R_{111}$ of the resistance 111 connected with the drain of the transistor 113 is 20 Ω, the number m of the diodes 117 for compensation of the voltage $V_{112}$ at the node 112 is 1, the number n of the diodes 118 in the temperature compensation circuit 153 is 3, and the resistance value $R_{120}$ of the resistance 120 in the temperature compensation circuit 153 is 1.8 KΩ. The temperature change and the threshold voltage change are same ranges as in the first embodiment. As shown in FIG. 15, the gate voltage $V_{106}$ is lowered as the temperature is lowered.

Figure 16:
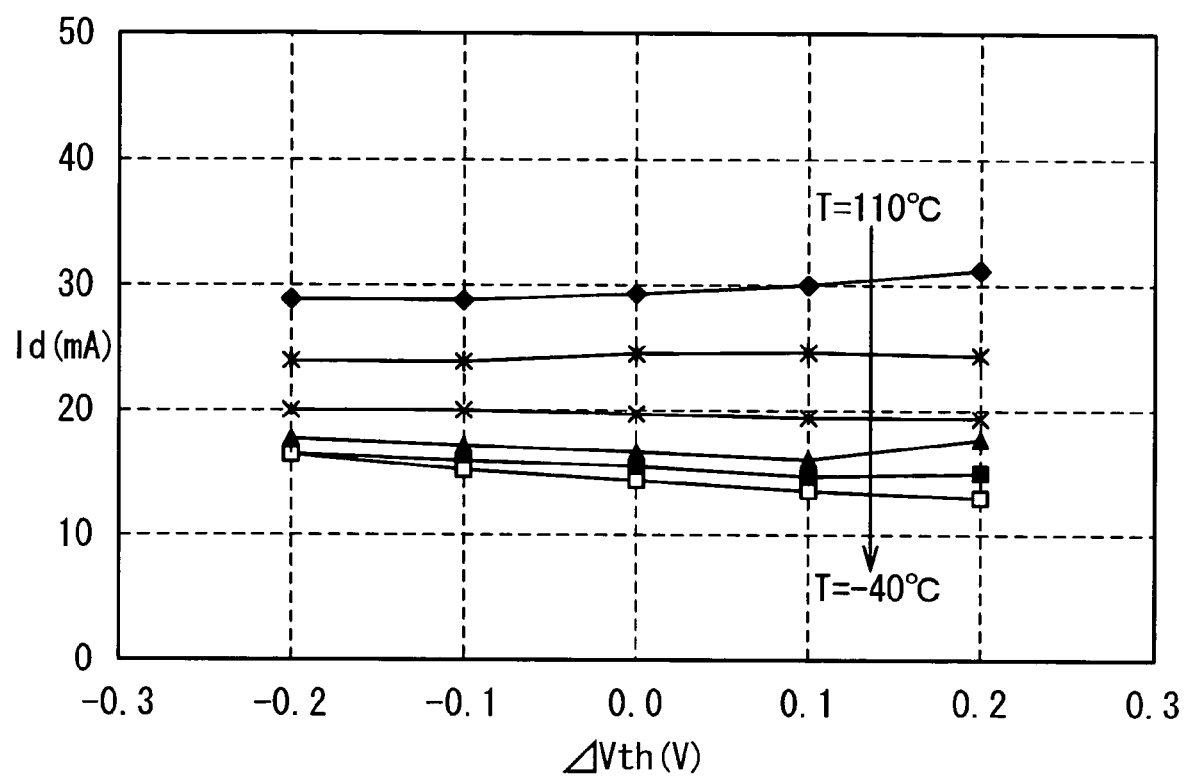
FIG. 16 is a graph showing a relation of drain current and threshold voltage change in the bias circuit shown in FIG. 14.
Figure 17:
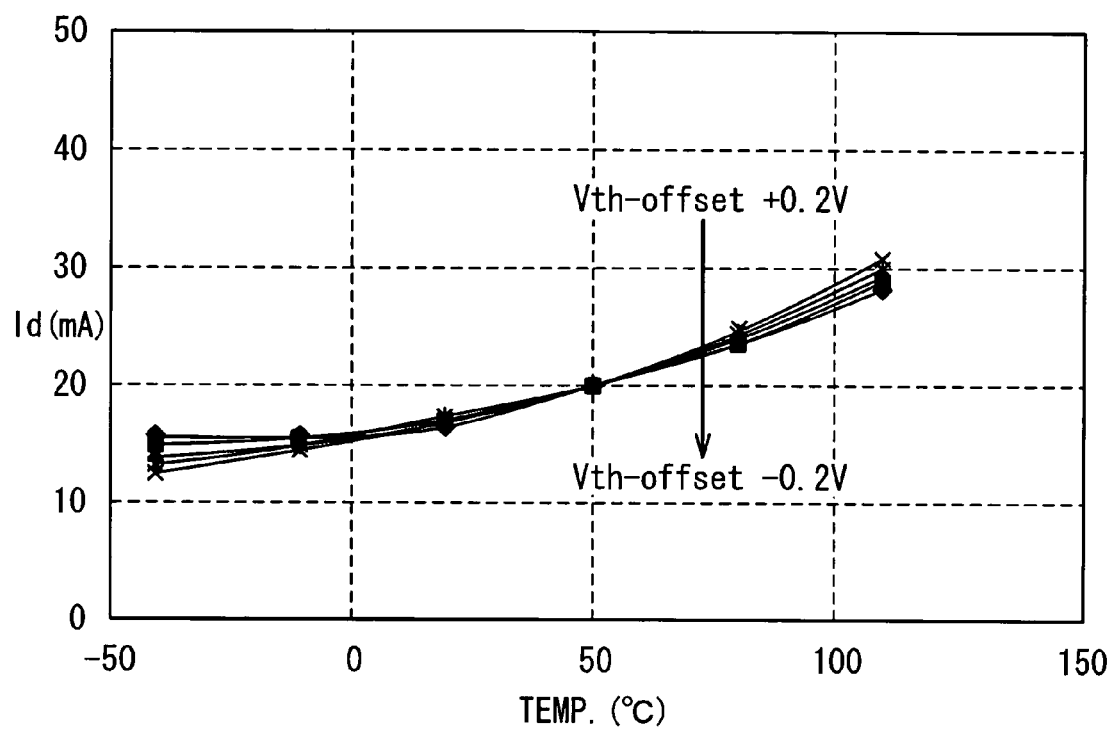
FIG. 17 is a graph showing a relation of drain current and temperature change in the bias circuit shown in FIG. 14.

FIGS. 16 and 17 show the change of the drain current 103 in the transistor 104 in this case. In FIG. 16, the drain current 103 is plotted for the threshold voltage change, and in FIG. 17, the drain current 103 is plotted for the temperature change. FIG. 16 indicates that the bias circuit shown in FIG. 14 operates so that the drain current 103 is kept constant to the threshold voltage change. Also, FIG. 17 indicates that the bias circuit shown in FIG. 14 operates so that the drain current 103 is lowered with the temperature decrease. In this way, it is possible to compensate both of the threshold voltage change and the temperature change by using the bias circuit in the second embodiment.

The calculation result of the S21 characteristic change in the two-stage amplifier of the 38 GHz band indicates ΔS21=3.02 dB. The S21 characteristic change is restrained to about ½ in the bias circuit in the second embodiment, comparing with the conventional circuit shown in FIG. 5. As a result, the bias circuit in the second embodiment has the same effect as that in the first embodiment.

[Third Embodiment]

Figure 18:
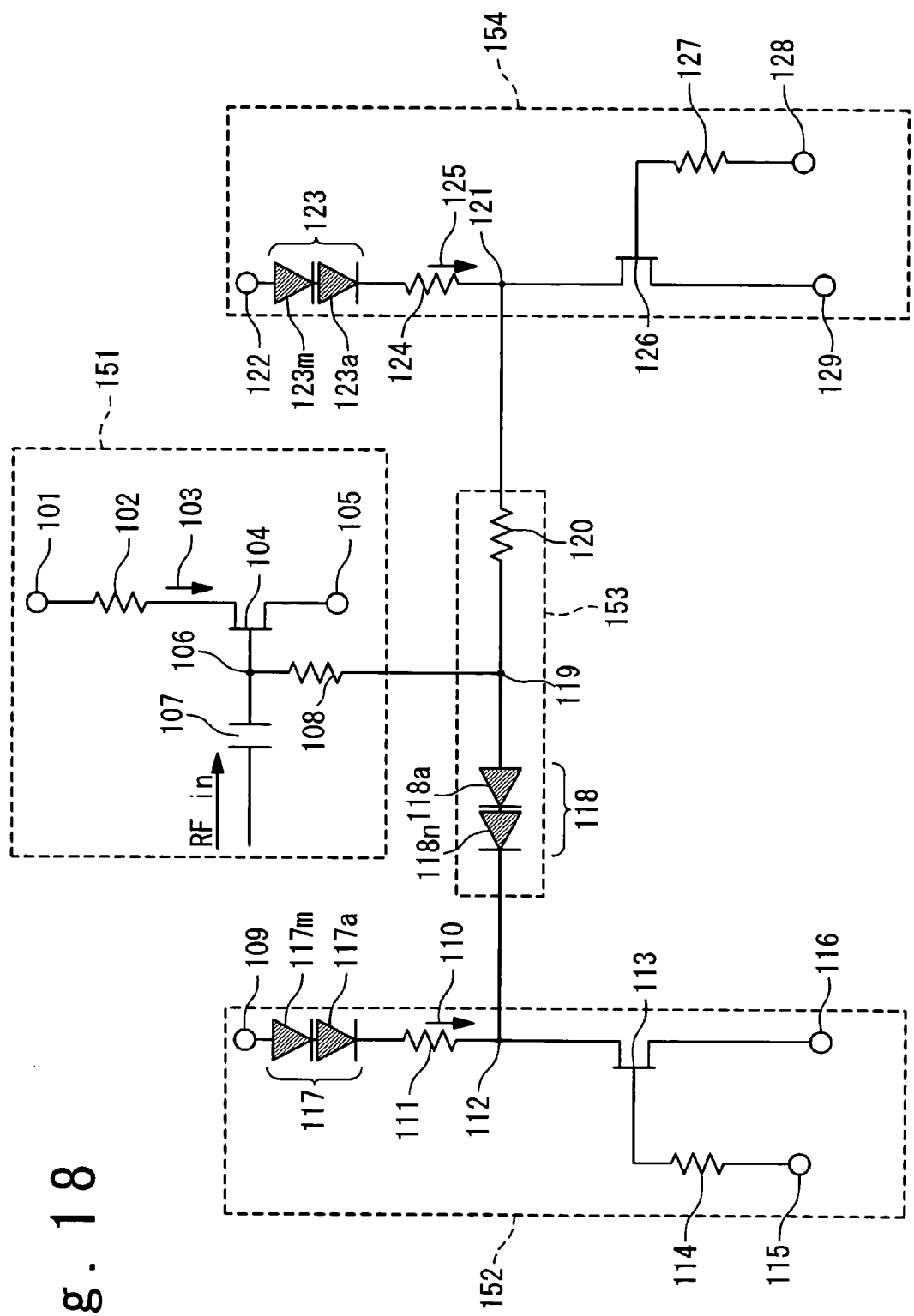
FIG. 18 is a circuit diagram showing the circuit configuration of the bias circuit according to a third embodiment of the present invention.

FIG. 18 shows a circuit diagram of a bias circuit in a third embodiment of the present invention. The bias circuit has both of the threshold voltage change compensation function and the temperature change compensation function, as well as in the first and second embodiments. In the third embodiment, the temperature compensation circuit 153 is configured of the diodes 118 and a resistance 120 which operates to lower the voltage 119 with the decrease of the temperature, as well as in the first embodiment. The threshold voltage change compensation circuit 152 is same as in the second embodiment.

In the third embodiment, a circuit 154 is further included. The circuit 154 has a transistor (a third active element) 126, a resistance 124, a resistance 127, and diodes 123. The circuit 154 is connected with on a lower voltage side of the temperature compensation circuit 153, i.e., an opposite end of the resistance 120 to the voltage 119. The transistor 126 is the same DC characteristic as the transistor 104, i.e., has the same threshold voltage as the transistor 104. A voltage 122 is applied to the drain of the transistor 126 through the resistance 124 and the m diodes 123 (123a to 123m). A voltage 129 is applied to the source of the transistor 126, and a voltage 128 is applied to the gate of the transistor 126 through the resistance 127. A node 121 between the drain of the transistor 126 and the resistance 124 is connected to the lower voltage end of the temperature compensation circuit 153 (the opposite end of the resistance 120 to the voltage 119).

The circuit 154 has the transistor 126, the resistance 124, and the diodes 123, and the threshold voltage change compensation circuit 152 has the transistor 113, the resistance 111, and the diodes 117. Here, the voltage 122, the voltage 128, and the voltage 129 in the circuit 154 are set so as to operate almost equally in a DC manner to the threshold voltage change compensation circuit 152.

The transistor 113 and the transistor 126 have the same DC characteristic. Therefore, when the threshold voltage is changed, the voltage at the node 112 ($V_{1112}$) and the voltage of the node 121 ($V_{121}$) are changed by a same amount. Therefore, the absolute value $|V_{112}-V_{121}|$ of the voltage difference between the voltage $V_{112}$ and the voltage $V_{121}$ is constant, so that the voltage drop in the resistance 120 is continuously constant. Therefore, the amount of the change of the voltage 119 is equal to the amount of the change of the voltage ($V_{112}$) or the voltage ($V_{121}$) As a result, the compensation effect by the threshold voltage change compensation circuit 152 can be directly reflected to the voltage 119, that is, to the gate voltage $V_{106}$ of the transistor 104. Consequently, the bias circuit in the third embodiment achieves a higher efficiency of the threshold voltage compensation than those in the first and second embodiments.

Similarly, the absolute value $|V_{112}-V_{121}|$ of the voltage difference at the temperature change is kept constant. Therefore, the compensation effect by the temperature compensation circuit 153 can be directly reflected to the gate voltage $V_{106}$ of the transistor 104. It should be noted that the amplifier 151 in the third embodiment is same as that in the first embodiment.

Figure 19:
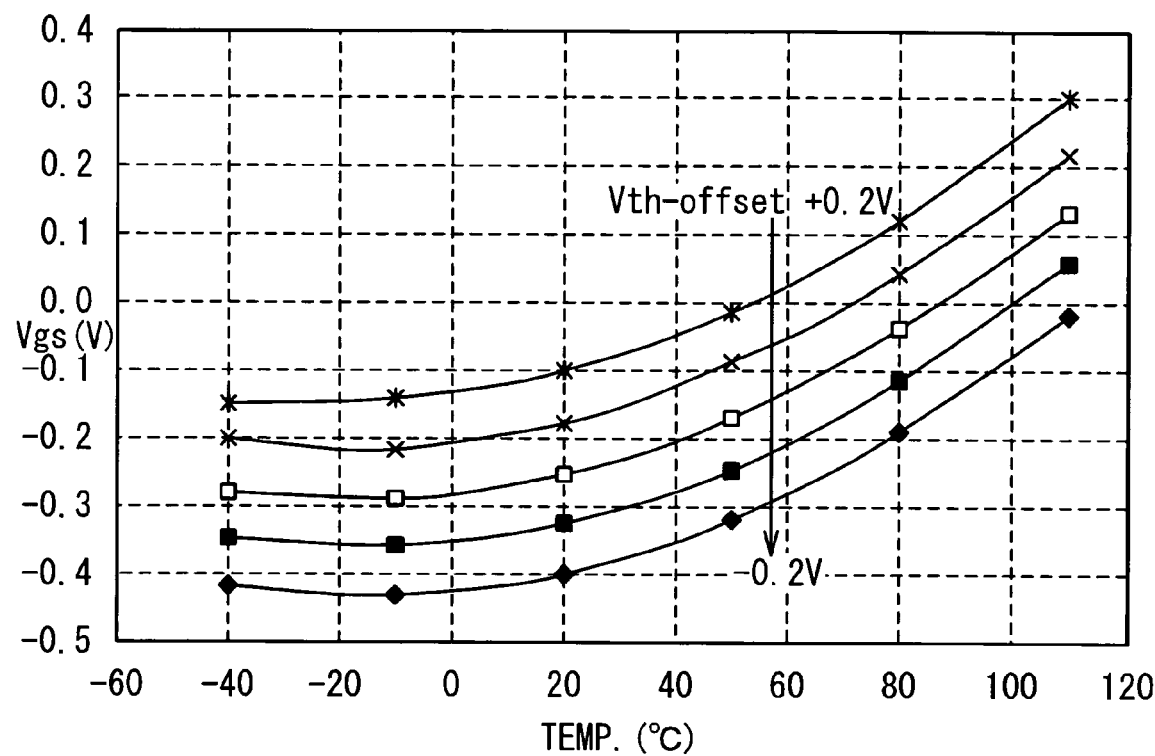
FIG. 19 is a graph showing a relation of voltage change of gate voltage of the RF amplifying transistor when the bias circuit shown in FIG. 18 is used.

FIG. 19 is a graph showing the voltage change of the gate voltage $V_{106}$ of the RF amplifying transistor 104 when the bias circuit shown in FIG. 18 is used. More specifically, FIG. 19 shows calculation results at 25° C. for the following conditions, that is, the drain current 110 $I_{d110}$ of the transistor 113 is 8 mA, the resistance value $R_{111}$ of the resistance 111 connected with the drain of the transistor 113 is 20 Ω, the number m of the diodes 117 for compensation of the voltage at the node 112 is 1, the number n of the diodes 118 in the temperature compensation circuit 153 is 3, the resistance value $R_{120}$ of the resistance 120 in the temperature compensation circuit 153 is 1.2 KΩ, the drain current $Id_{125}$ Of the transistor 126 is 8 mA, the resistance value $R_{124}$ of the resistance 124 connected with the drain of the transistor 126 is 20 Ω, the number m of the diodes 123 for compensation of the voltage $V_{123}$ is 1, and the temperature change and the threshold voltage change are same range as in the first embodiment. As shown in FIG. 19, the gate voltage $V_{106}$ is lowered as the temperature is lowered.

Figure 20:
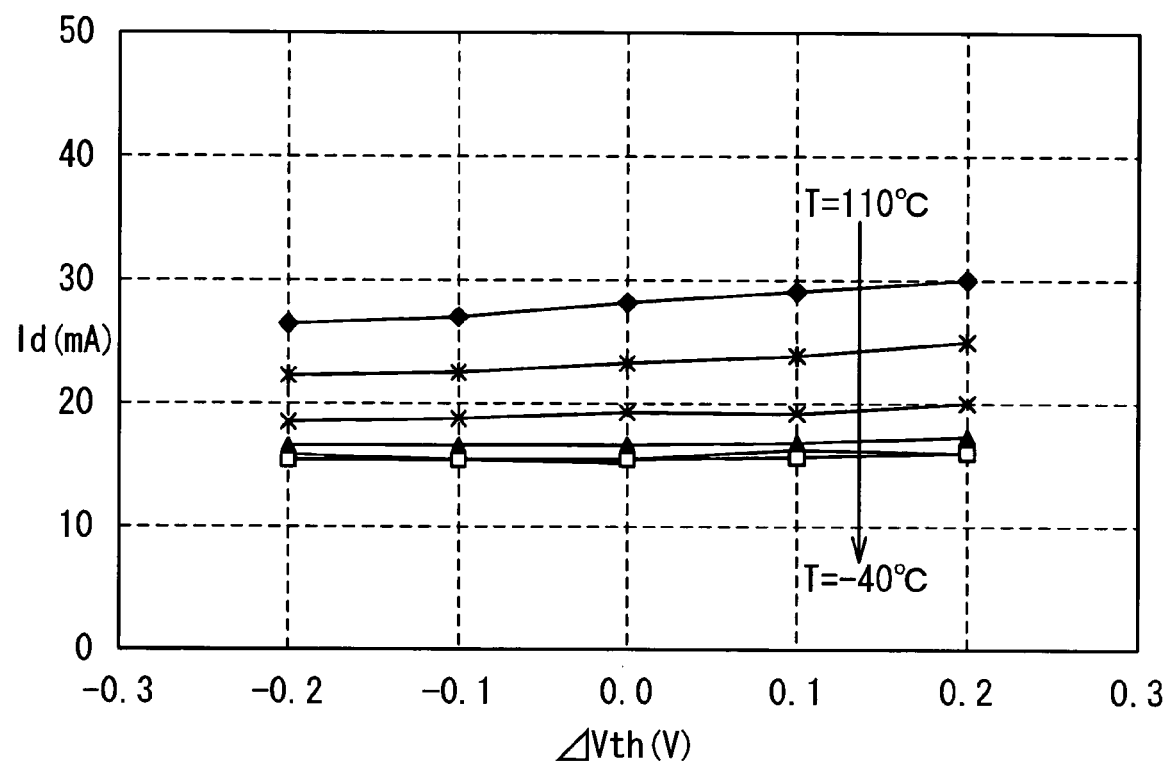
FIG. 20 is a graph showing a relation of drain current and threshold voltage change in the bias circuit shown in FIG. 18.
Figure 21:
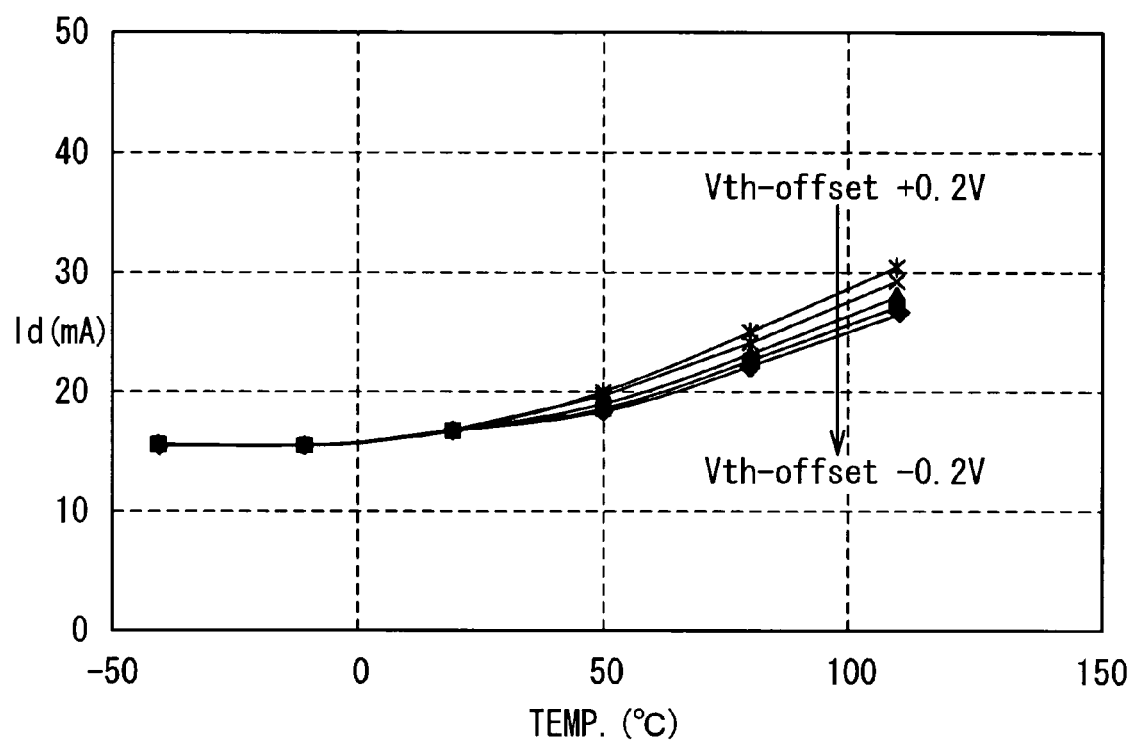
FIG. 21 is a graph showing a relation of drain current and temperature change in the bias circuit shown in FIG. 18.

FIGS. 20 and 21 show the change of the drain current 103 in the transistor 104 in this case. In FIG. 20, the drain current 103 is plotted for the threshold voltage change, and in FIG. 21, the drain current 103 is plotted for the temperature change. FIG. 20 indicates that the bias circuit in the third embodiment operates so that the drain current 103 is kept constant to the threshold voltage change. Moreover, FIG. 20 indicates that the bias circuit in the third embodiment operates so that the drain current 103 is lowered with the temperature decrease.

The calculation result of the S21 characteristic change in the two-stage amplifier of the 38 GHz-band is ΔS21=2.86 dB. The S21 characteristic change can be restrained to about ½ in the bias circuit in the third embodiment, comparing with the conventional circuit shown in FIG. 5. As a result, the bias circuit in the third embodiment has the same effect as those in the first and second embodiments. In addition, the bias circuit in the third embodiment is superior in the threshold voltage change compensation effect to those in the first and second embodiments.

[Forth embodiment]

Figure 22:
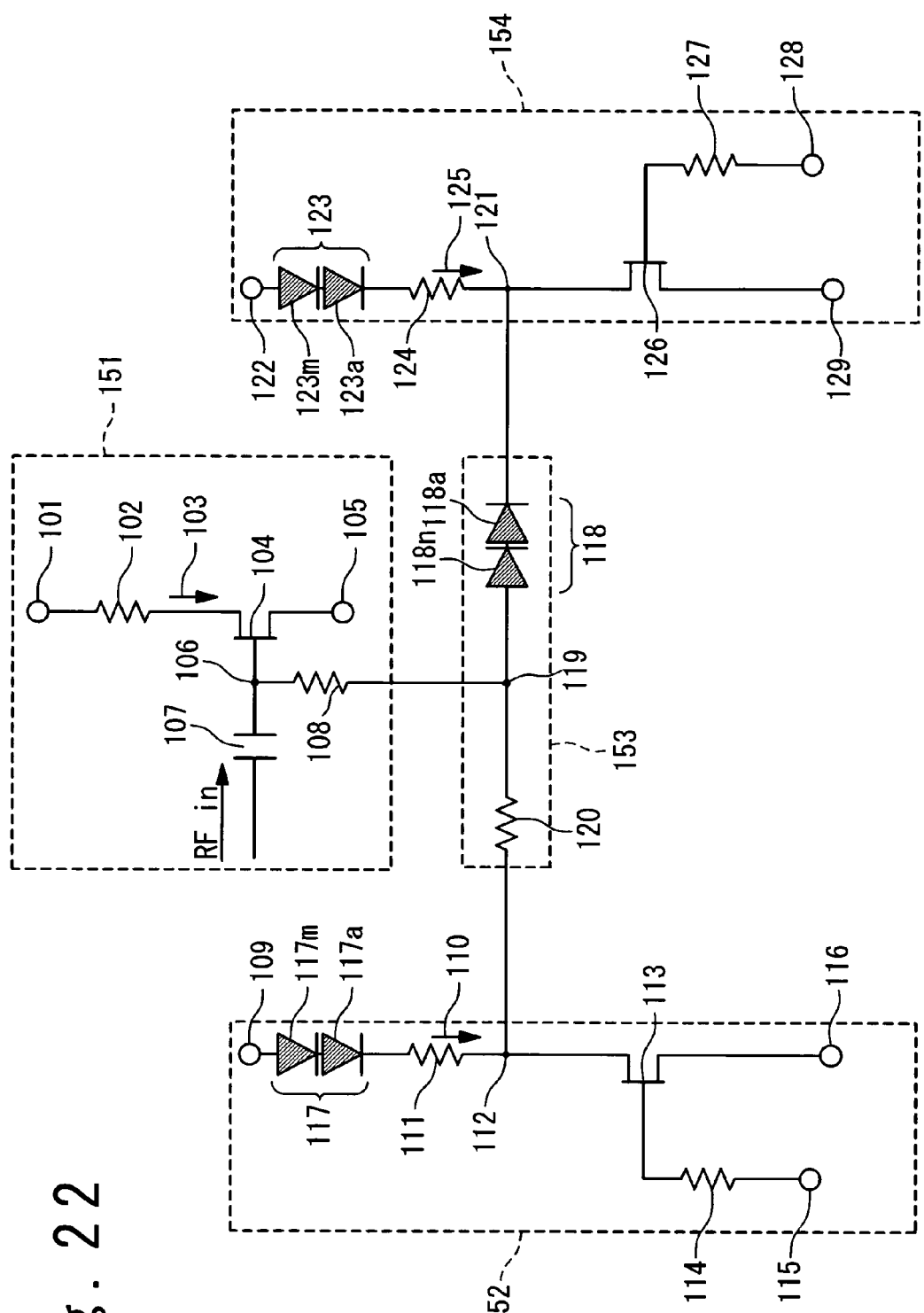
FIG. 22 is a circuit diagram showing the bias circuit according to a forth embodiment of the present invention.

FIG. 22 shows a circuit diagram of the bias circuit according to the forth embodiment of the present invention. The bias circuit has both of the threshold voltage change compensation function and the temperature change compensation function, as well as in the first to third embodiments.

In the first to third embodiments, the voltage of the gate bias point 106 in the transistor 104 is lowered with the temperature decrease so that the transistor has a characteristic that the gain is kept constant. However in the fourth embodiment, the voltage of the gate bias point 106 in the transistor 104 is raised with the temperature decrease so that the transistor has a characteristic that the gain is kept constant.

In the forth embodiment, a circuit which has the threshold voltage change compensation function is the same as that in the third embodiment, and includes the threshold voltage change compensation circuit 152, which is composed of the transistor 113, the resistance 111, and the diodes 117, and a circuit 154, which includes the transistor 126, the resistance 124, and the diodes 123. The node 112 is connected with the nodes 121 through the resistance 120 and the diodes 118 in order as shown in FIG. 22. The amplifier 151 is the same as in the first embodiment.

The bias circuit in the forth embodiment has the compensation effect function and operates in the same way as in the third embodiment when the threshold voltage changes. At the high temperature, the voltage drop by the diodes 118 decreases, so that the voltage 119 decreases. At a low temperature, the voltage drop by the diodes 118 increases, so that the voltage 119 increases.

Figure 23:
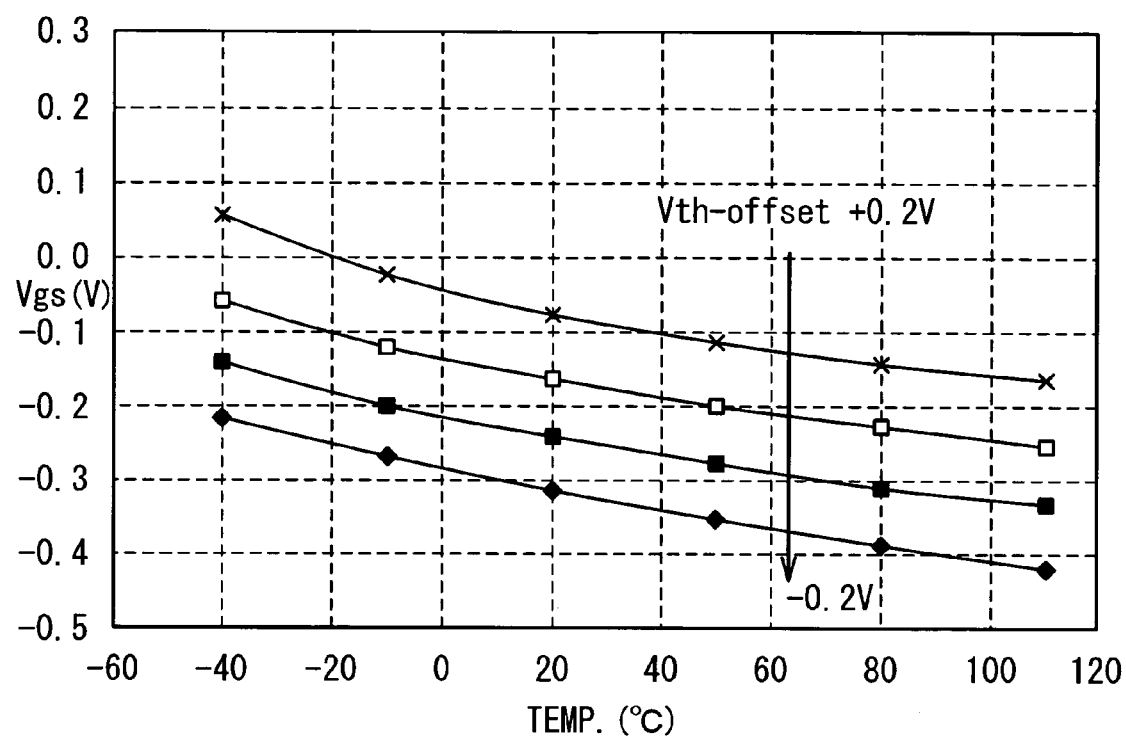
FIG. 23 is a graph showing a relation of change of the gate voltage of the RF amplifying transistor and temperature change when the bias circuit shown in FIG. 22 is used.

FIG. 23 is a graph showing the voltage change of the gate voltage $V_{106}$ of the RF amplifying transistor 104 when the bias circuit shown in FIG. 22 is used. More specifically, FIG. 23 shows calculation results at 25° C. under the following conditions, that is, the drain current $I_{d110}$ of the transistor 113 is 8 mA, the resistance value $R_{111}$ of the resistance 111 connected with the drain of the transistor 113 is 20 Ω, the number m of the diodes 117 for compensation of the voltage at the node 112 is 1, the number n of the diodes 118 in the temperature compensation circuit 153 is 1, the resistance value $R_{120}$ of the resistance 120 in the temperature compensation circuit 153 is 2.2 KΩ, the drain current $Id_{125}$ of the transistor 126 is 8 mA, the resistance value $R_{124}$ of the resistance 124 connected with the drain of the transistor 126 is 20 Ω, the number m of the diodes 123 for compensation of the voltage at the node 121 is 1, and the temperature change and the threshold voltage change are same range as in the first embodiment. As shown in FIG. 23, the gate voltage $V_{106}$ is lowered as the temperature is lowered.

Figure 24:
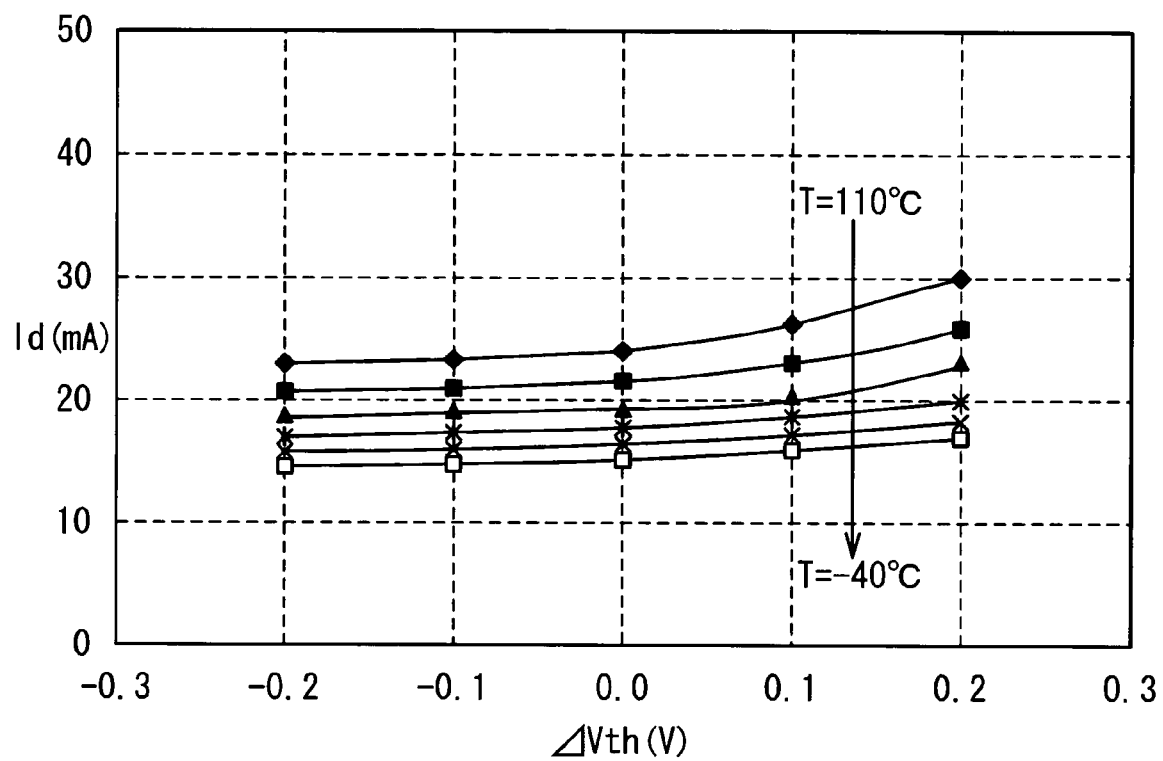
FIG. 24 is a graph showing a relation of drain current and threshold voltage change in the bias circuit shown in FIG. 24.
Figure 25:
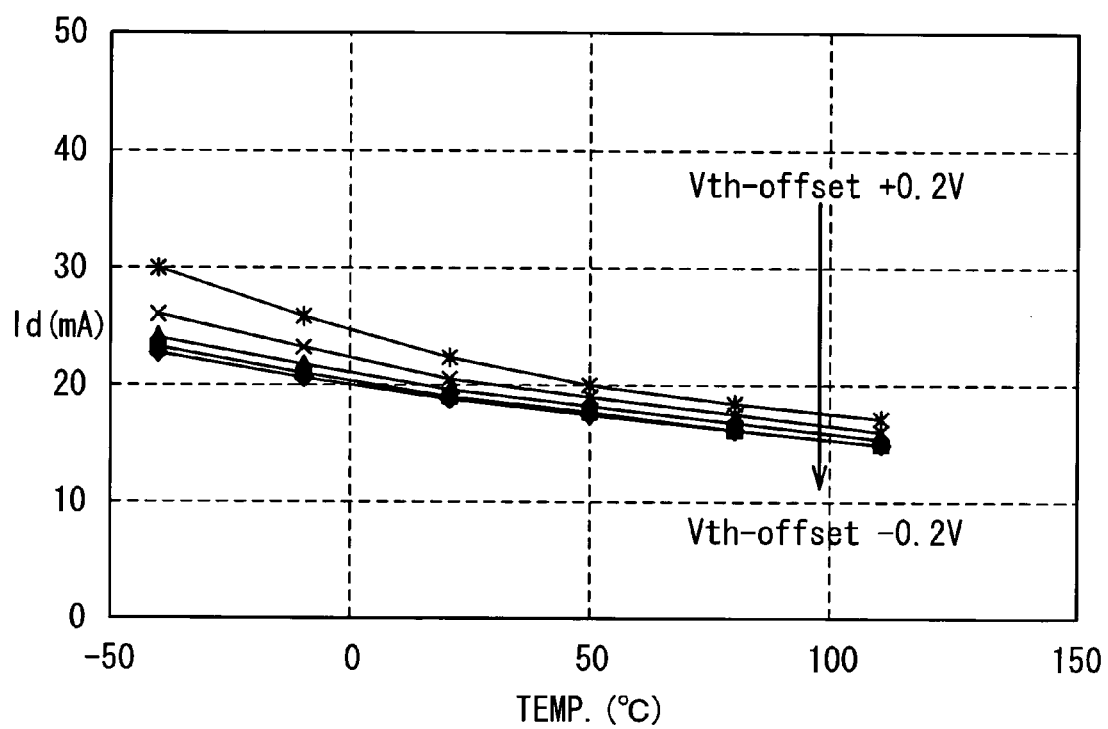
FIG. 25 is a graph showing a relation of drain current and temperature change in the bias circuit shown in FIG. 24.

FIGS. 24 and 25 show the change of the drain current 103 in the transistor 104 in this case. In FIG. 24, the drain current 103 is plotted for the threshold voltage change, and in FIG. 25, the drain current 103 is plotted for the temperature change. FIG. 24 indicates that the bias circuit in the forth embodiment operates so that the drain current 103 is kept constant with the threshold voltage change. Moreover, FIG. 25 indicates that the bias circuit in the forth embodiment operates so that the drain current 103 is lowered with the temperature decrease. As a result, the bias circuit in the forth embodiment has the same effect as that in the third embodiments.

[Fifth Embodiment]

Figure 26:
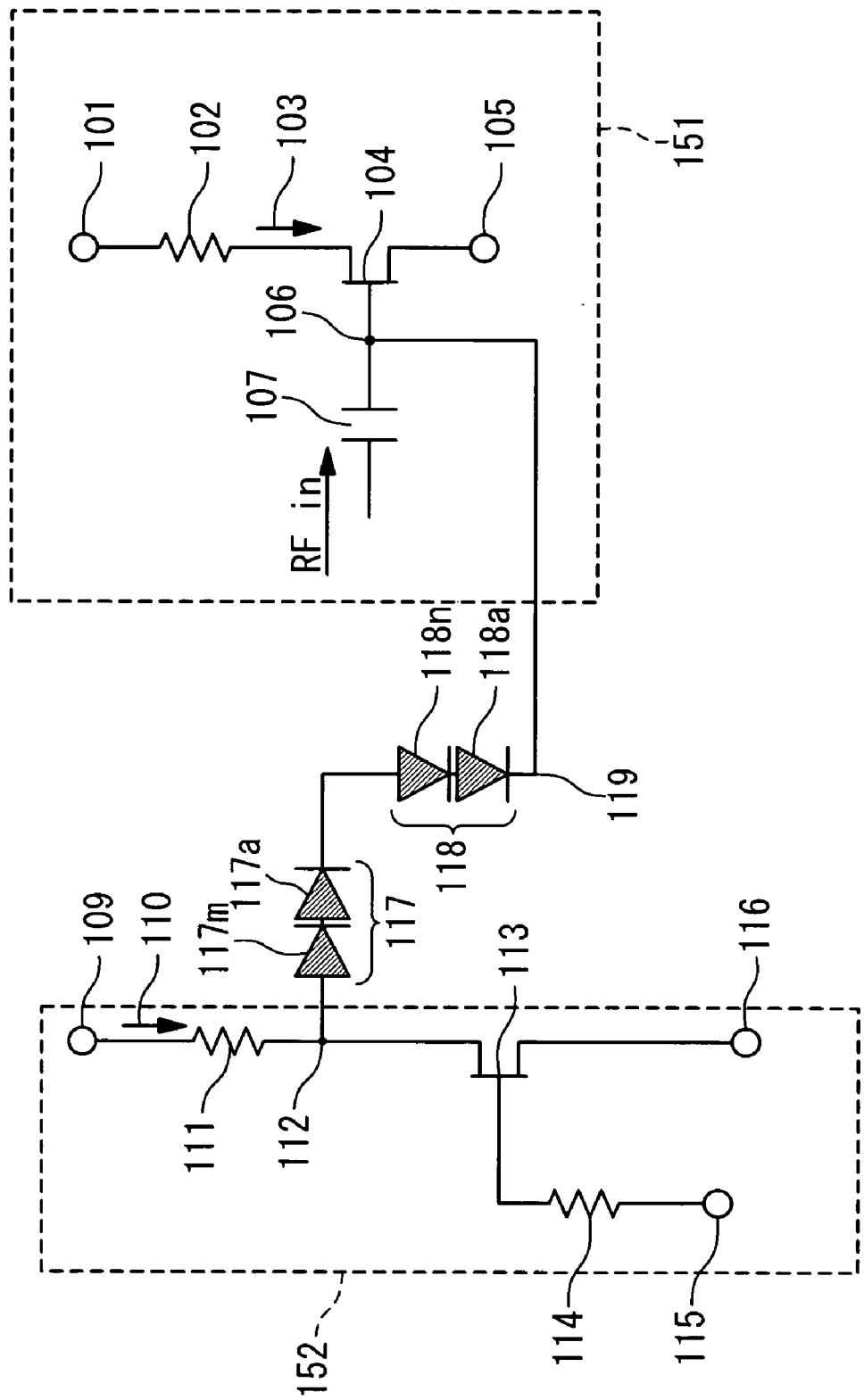
FIG. 26 is a circuit diagram showing the bias circuit according to a fifth embodiment of the present invention.

FIG. 26 shows a circuit diagram of the bias circuit according to the fifth embodiment of the present invention. The bias circuit has both the threshold voltage change compensation function and the temperature change compensation function, as well as in the first to forth embodiments.

In the first to forth embodiments, a voltage-controlled type transistor is used. However, in the fifth embodiment, a current-controlled type transistor is used.

In the fifth embodiment, the threshold voltage change compensation circuit 152 is the same as that in the first embodiment. With the m diodes 117 for the compensation of the voltage at the node 112 and an amplifier 151, the bias circuit in the fifth embodiment is the same as that in the first embodiment.

In the fifth embodiment, the transistor 104 is the current-controlled type transistor. Therefore, the voltages 106 and 119 are mutually short-circuited, and the current flowing through the diodes 118 is flown through the transistor 104. That is to say, the circuit for the temperature compensation includes only the diodes 118 without the resistance 120. In the fifth embodiment, the voltage $V_{112}$ at the node 112 is changed as the threshold voltage changes. A current change corresponding to the voltage change compensates the transistor 104. Further, with the temperature change, the voltage 119 changes and the current flowing through the transistor 104 is changed. Thus, the RF characteristic of the transistor 104 can be compensated.

Figure 27:
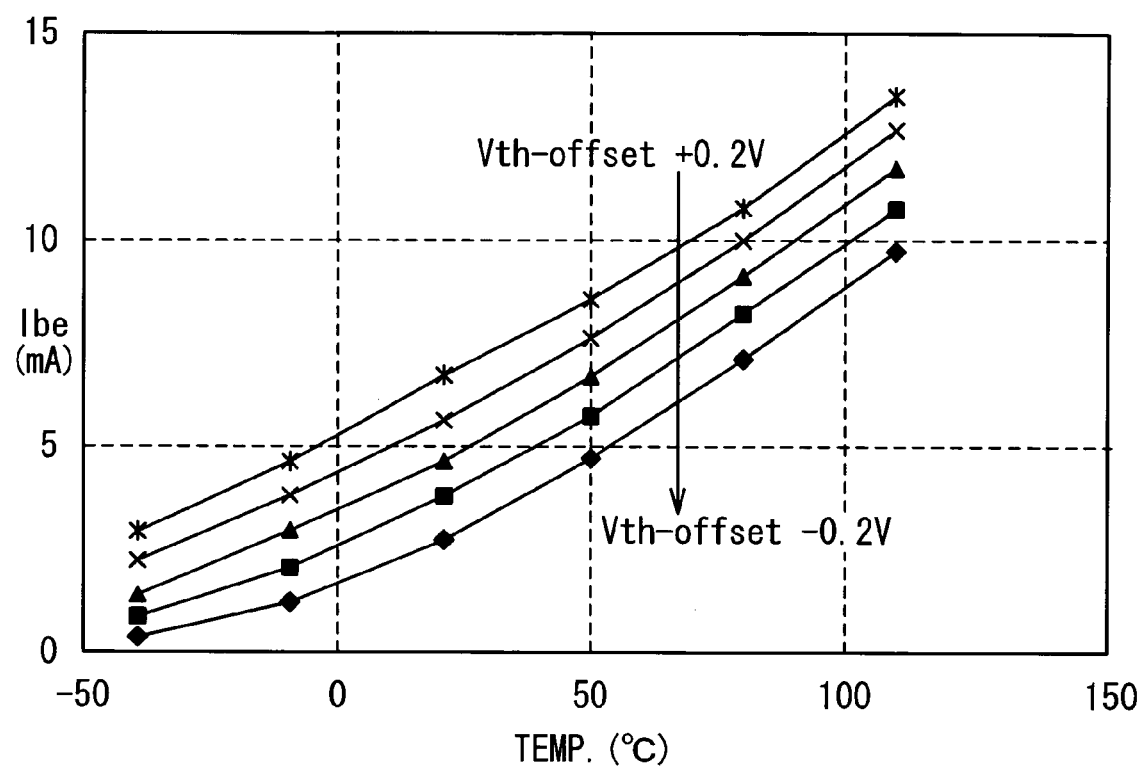
FIG. 27 is a graph showing a relation of base current and temperature change in the RF amplifying transistor when the bias circuit shown in FIG. 26 is used.

FIG. 27 is a graph showing a base current characteristic to the temperature change of the RF amplifying transistor when the bias circuit shown in FIG. 26 is used. More specifically, FIG. 27 shows calculation results at 25° C. under the following conditions, that is, a collector current $IC_{110}$ is 8 mA, the resistance value $R_{111}$ of the resistance 111 connected with the collector of the transistor 113 is 20 Ω, the number m of the diodes 117 for compensation of the voltage $V_{112}$ is 2, the number n of the diodes 118 is 1, and the temperature change and the threshold voltage change are same range as in the first embodiment. As shown in FIG. 27, the base current is lowered as the temperature is lowered, and the effect of the threshold voltage change compensation is present. As a result, the bias circuit in the fifth embodiment has the same effect as that in the first to third embodiments.

What is claimed is:

1. A bias circuit which applies a bias voltage to a control terminal of a first active element for an RF signal amplification, comprising:
a threshold voltage change compensation circuit having a second active element and configured to compensate said bias voltage based on a change in threshold voltage of said first active element by using said second active element; and
a first temperature compensation circuit connected between said control terminal and said voltage change compensation circuit and configured to compensate a change in said bias voltage based on a temperature change,
wherein said threshold voltage change compensation circuit comprises a first resistance connected with said second active element, and
wherein said threshold voltage change compensation circuit further comprises a second temperature compensation circuit configured to compensate a first voltage of a first node between said first resistance and said second active element based on said temperature change.

2. The bias circuit according to claim 1, wherein said first and second active elements are transistors.

3. The bias circuit according to claim 2, wherein said first and second active elements are voltage controlled-type transistors.

4. The bias circuit according to claim 2, wherein said first and second active elements are current controlled-type transistors.

5. The bias circuit according to claim 1, wherein said second active element has a same threshold voltage as said first active element.

6. The bias circuit according to claim 1, wherein said second temperature compensation circuit comprises a first diode circuit containing at least one diode.

7. A bias circuit which applies a bias voltage to a control terminal of a first active element for an RF signal amplification, comprising:
a threshold voltage change compensation circuit having a second active element and configured to compensate said bias voltage based on a change in threshold voltage of said first active element by using said second active element; and a first temperature compensation circuit connected between said control terminal and said voltage change compensation circuit and configured to compensate a change in said bias voltage based on a temperature change, wherein said threshold voltage change compensation circuit comprises a first resistance connected with said second active element, and further comprising:

a second temperature compensation circuit interposed between said threshold voltage change compensation circuit and said first temperature compensation circuit to compensate a first voltage of a first node between said first resistance and said second active element based on said temperature change.

8. The bias circuit according to claim 7, wherein said second temperature compensation circuit comprises a first diode circuit containing at least one diode.

9. The bias circuit according to claim 6, wherein said diode in said first diode circuit is a Schottky diode or a diode with a negative temperature coefficient.

10. The bias circuit according to claim 8, wherein said diode in said first diode circuit is a Schottky diode or a diode with a negative temperature coefficient.

11. The bias circuit according to claim 1, wherein said first temperature compensation circuit comprises a second diode circuit containing at least one diode.

12. The bias circuit according to claim 11, wherein said first temperature compensation circuit further comprises a second resistance connected with said second diode circuit.

13. The bias circuit according to claim 11, wherein said diode in said second diode circuit is a Schottky diode or a diode with a negative temperature coefficient.

14. A bias circuit which applies a bias voltage to a control terminal of a first active element for an RF signal amplification, comprising:

a threshold voltage change compensation circuit having a second active element and configured to compensate said bias voltage based on a change in threshold voltage of said first active element by using said second active element; and a first temperature compensation circuit connected between said control terminal and said voltage change compensation circuit and configured to compensate a change in said bias voltage based on a temperature change, wherein said first temperature compensation circuit comprises a second diode circuit containing at least one diode, wherein said first temperature compensation circuit further comprises a second resistance connected with said second diode circuit, and wherein a second node between said second resistance and said second diode circuit is connected with said control terminal, and said bias circuit further comprises:

an additional circuit comprising a third resistance and a third active element connected with said third resistance, connected with said first temperature compensation circuit on a lower voltage side of said first temperature compensation circuit.

15. The bias circuit according to claim 14, wherein said additional circuit further comprises:

a third temperature compensation circuit configured to compensate a second voltage of a third node between said third resistance and said third active element based on said temperature change.

16. The bias circuit according to claim 15, wherein said third temperature compensation circuit comprises a third diode circuit containing at least one diode.

17. The bias circuit according to claim 16, wherein said diode in said second diode circuit is a Schottky diode or a diode with a negative temperature coefficient.

18. The bias circuit according to claim 14, wherein said second and third active elements have a same threshold voltage as said first active element.

* * * * *